(12) United States Patent
Edwards et al.

(10) Patent No.: US 10,879,387 B2
(45) Date of Patent: Dec. 29, 2020

(54) DRAIN CENTERED LDMOS TRANSISTOR WITH INTEGRATED DUMMY PATTERNS

(71) Applicant: Texas Instruments Incorporated, Dallas, TX (US)

(72) Inventors: Henry Litzmann Edwards, Garland, TX (US); James Robert Todd, Plano, TX (US); Binghua Hu, Plano, TX (US); Xiaoju Wu, Dallas, TX (US); Stephanie L. Hilbun, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/574,394

(22) Filed: Sep. 18, 2019

(65) Prior Publication Data

US 2020/0013890 A1    Jan. 9, 2020

Related U.S. Application Data

(63) Continuation of application No. 16/021,772, filed on Jun. 28, 2018, now Pat. No. 10,461,182.

(51) Int. Cl.
| | |
|---|---|
| *H01L 29/66* | (2006.01) |
| *H01L 29/78* | (2006.01) |
| *H01L 29/423* | (2006.01) |
| *H01L 29/08* | (2006.01) |
| *H01L 29/10* | (2006.01) |

(52) U.S. Cl.
CPC ...... *H01L 29/7816* (2013.01); *H01L 29/0865* (2013.01); *H01L 29/0882* (2013.01); *H01L 29/1095* (2013.01); *H01L 29/4232* (2013.01); *H01L 29/66681* (2013.01)

(58) Field of Classification Search
CPC . H01L 29/78; H01L 29/7816; H01L 29/0865; H01L 29/0882; H01L 29/1095
See application file for complete search history.

(56) References Cited

U.S. PATENT DOCUMENTS

| | | |
|---|---|---|
| 6,587,320 B1 | 7/2003 | Russ et al. |
| 7,141,455 B2 | 11/2006 | Hu et al. |
| 7,696,049 B2 | 4/2010 | Hu et al. |
| 7,713,825 B2 | 5/2010 | Hu et al. |
| 7,732,863 B2 | 6/2010 | Pendharkar et al. |
| 7,745,294 B2 | 6/2010 | Pendharkar et al. |
| 7,772,075 B2 | 8/2010 | Pendharkar et al. |
| 7,772,644 B2 | 8/2010 | Pendharkar et al. |
| 7,893,499 B2 | 2/2011 | Denison et al. |
| 7,989,232 B2 | 8/2011 | Wand et al. |
| 8,114,744 B2 | 2/2012 | Chatterjee et al. |

(Continued)

*Primary Examiner* — Phuc T Dang
(74) *Attorney, Agent, or Firm* — Jacqueline J. Garner; Charles A. Brill; Frank D. Cimino

(57) ABSTRACT

Described examples include integrated circuits, drain extended transistors and fabrication methods therefor, including a multi-fingered transistor structure formed in an active region of a semiconductor substrate, in which a transistor drain finger is centered in a multi-finger transistor structure, a transistor body region laterally surrounds the transistor, an outer drift region laterally surrounds an active region of the semiconductor substrate, and one or more inactive or dummy structures are formed at lateral ends of the transistor finger structures.

17 Claims, 28 Drawing Sheets

(56) References Cited

U.S. PATENT DOCUMENTS

| | | |
|---|---|---|
| 8,124,482 B2 | 2/2012 | Denison et al. |
| 8,253,193 B2 | 8/2012 | Denison et al. |
| 8,264,038 B2 | 9/2012 | Pendharkar et al. |
| 8,686,502 B2 | 4/2014 | Raghavan et al. |
| 8,704,271 B2 | 4/2014 | Edwards et al. |
| 9,006,833 B2 | 4/2015 | Edwards et al. |
| 9,076,863 B2 | 7/2015 | Tamura et al. |
| 9,306,013 B2 | 4/2016 | Babcock et al. |
| 9,461,032 B1 | 10/2016 | Edwards |
| 9,543,430 B2 | 1/2017 | Edwards |
| 9,608,105 B2 | 3/2017 | Tamura et al. |
| 9,633,994 B2 | 4/2017 | Babcock et al. |
| 9,698,246 B1 | 7/2017 | Edwards et al. |
| 9,887,288 B2 | 2/2018 | Edwards et al. |
| 2004/0079974 A1 | 4/2004 | Lin et al. |
| 2009/0191688 A1 | 7/2009 | Hu et al. |
| 2012/0086497 A1 | 4/2012 | Vorhaus |
| 2013/0240980 A1 | 9/2013 | Raghavan et al. |
| 2013/0341717 A1* | 12/2013 | Chen ................ H01L 29/66659 257/337 |
| 2014/0231901 A1 | 8/2014 | Anderson et al. |
| 2017/0077294 A1 | 3/2017 | Edwards |
| 2017/0084738 A1 | 3/2017 | Zhang et al. |
| 2017/0179260 A1 | 6/2017 | Edwards et al. |
| 2017/0365710 A1 | 12/2017 | Bobde et al. |

\* cited by examiner

DRAIN CENTERED LDMOS TRANSISTOR WITH INTEGRATED DUMMY PATTERNS

CROSS-REFERENCE TO RELATED APPLICATIONS

This application is a continuation of U.S. Nonprovisional patent application Ser. No. 16/021,772, filed Jun. 28, 2018, which relates to U.S. Nonprovisional patent application Ser. No. 16/021,601, filed Jun. 28, 2018, the entirety of which is herein incorporated by reference. This application is related to U.S. Nonprovisional patent application Ser. No. 16/021,647, filed Jun. 28, 2018, the contents of all of which is herein incorporated by reference in its entirety.

BACKGROUND

Drain extended transistors are useful in power switching circuits and other applications in which high voltage transistors are integrated with logic and other low voltage transistors on a single integrated circuit (IC). The design of the extended drain combines efficient operation as a low side switch in a switching power supply to provide low source-drain resistance (RDSON) during the on state, along with the ability to block or withstand high off-state voltages between the drain and the source or gate. The extended drain provides a relatively lightly doped drift region to extend the high voltage drain away from the edge of the channel region. A planar drift region can be used to increase the reverse blocking voltage beyond the voltage rating of the gate oxide in a particular process. For even higher drain voltage rating, the drain side of the gate polysilicon is spaced from the drift region by a field relief oxide to facilitate more complete depletion of the drift region. Reduced surface field (RE-SURF) profiled doping can be used for full reverse bias depletion of the drift region. The drift region doping level or dopant concentration is preferably higher near the connection to the transistor channel region to mitigate channel hot carrier injection into the gate and enhance the transistor reliability. One form of drain extended transistors is a laterally diffused metal oxide semiconductor device (LDMOS). In power switching circuits, such as DC-DC converters, a high-side switch and a low-side switch may be fabricated as drain extended transistors. In certain applications, a source/back gate terminal of the high-side device is isolated from circuit ground to facilitate high-voltage operation, and extra circuit area is needed to provide this isolation. In addition, shrinking geometries and alignment tolerances of advanced semiconductor manufacturing processes increase the performance impact of non-uniformities such as center-edge differences in device structure locations.

SUMMARY

Described examples include integrated circuits, drain extended transistors and fabrication methods therefor, including a multi-fingered transistor structure formed in an active region of a semiconductor substrate, in which a transistor drain finger is centered in a multi-finger transistor structure, a transistor body region laterally surrounds the transistor, an outer drift region laterally surrounds an active region of the semiconductor substrate, and one or more inactive or dummy structures are formed at lateral ends of the transistor finger structures.

DETAILED DESCRIPTION

Figure 1:
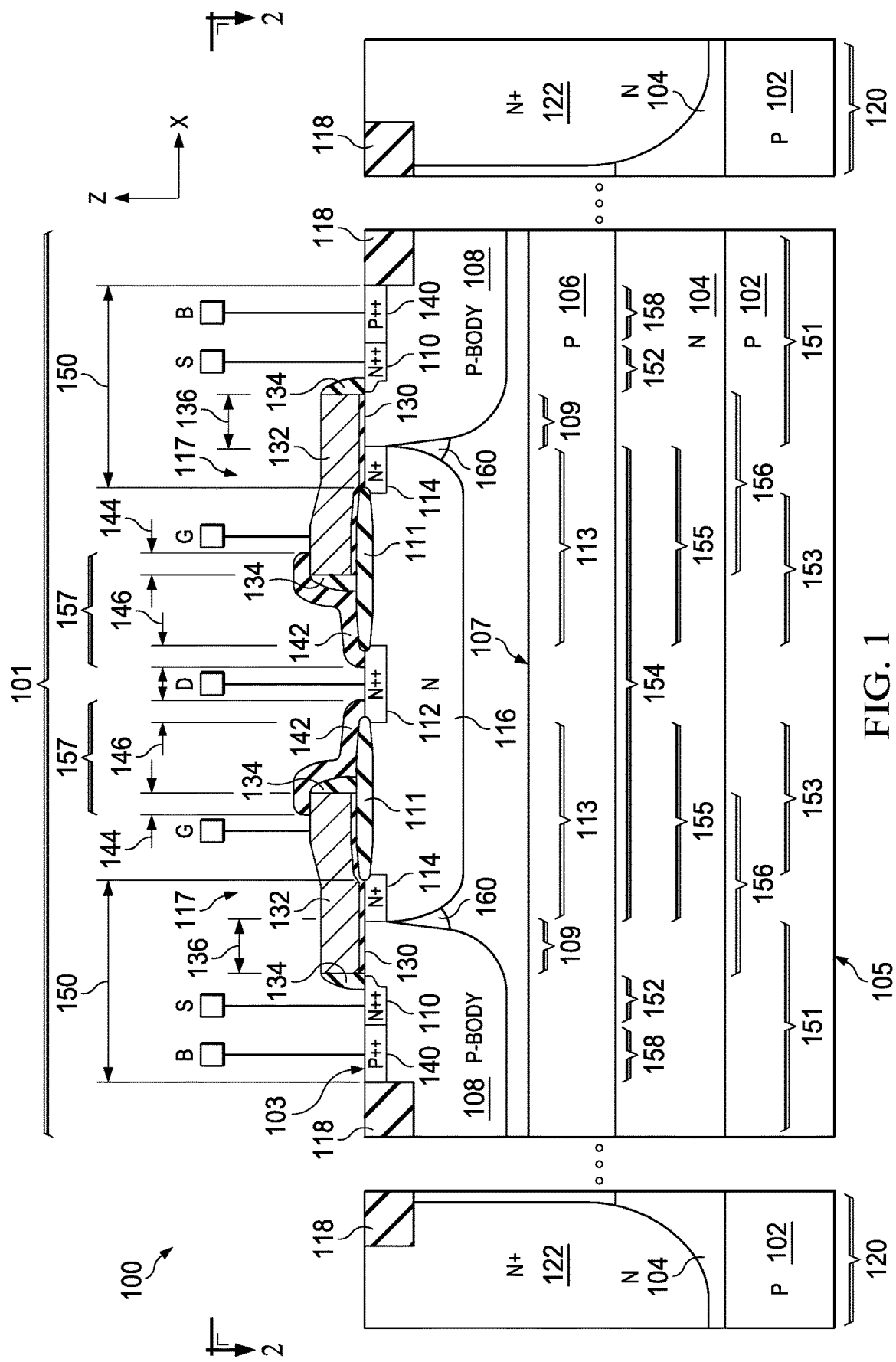
FIG. 1 is a partial sectional side elevation view of an integrated circuit including a drain extended transistor with a field oxide protection layer.
Figure 2:
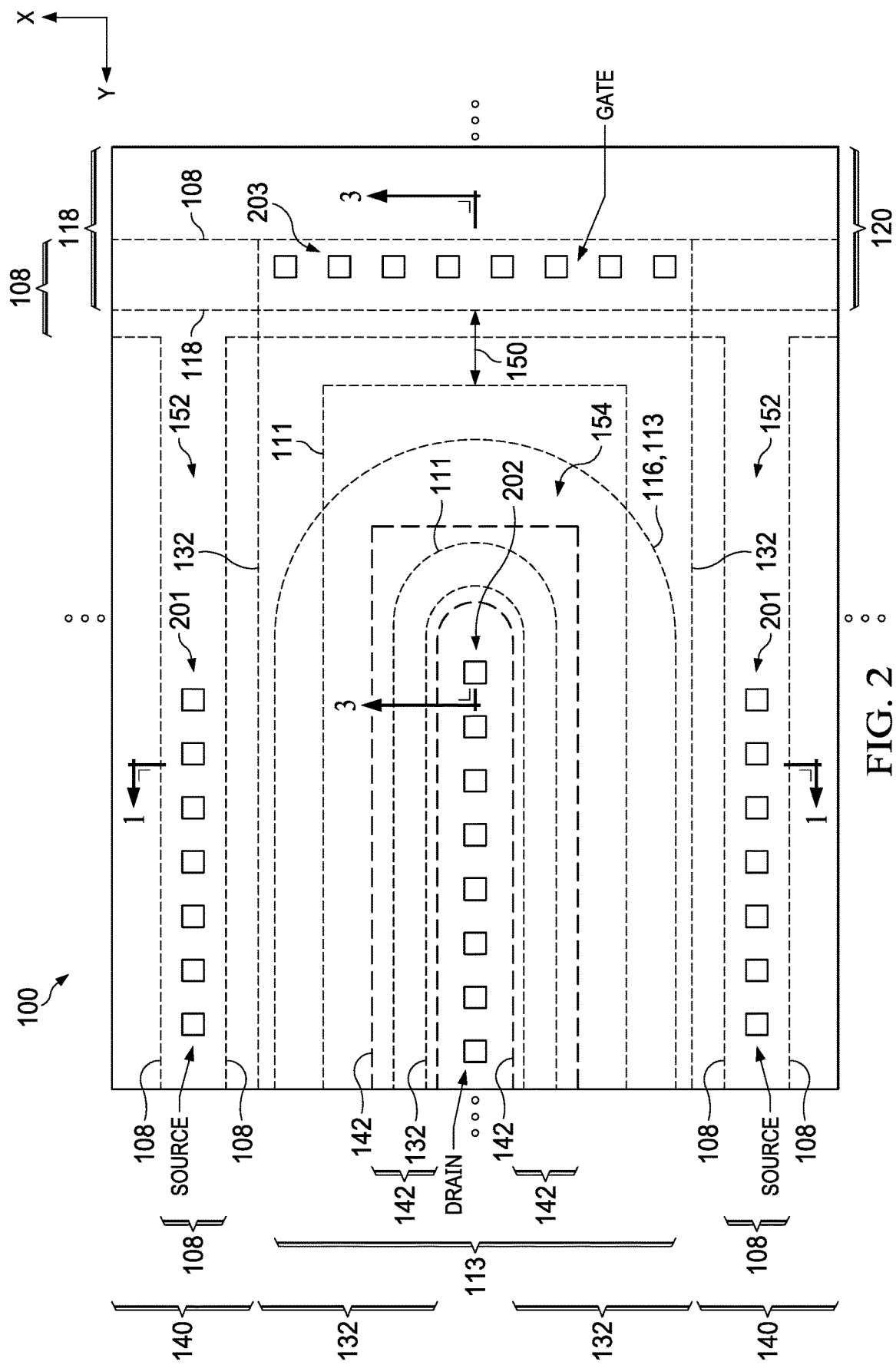
FIG. 2 is a partial top plan view of the integrated circuit of FIG. 1.
Figure 3:
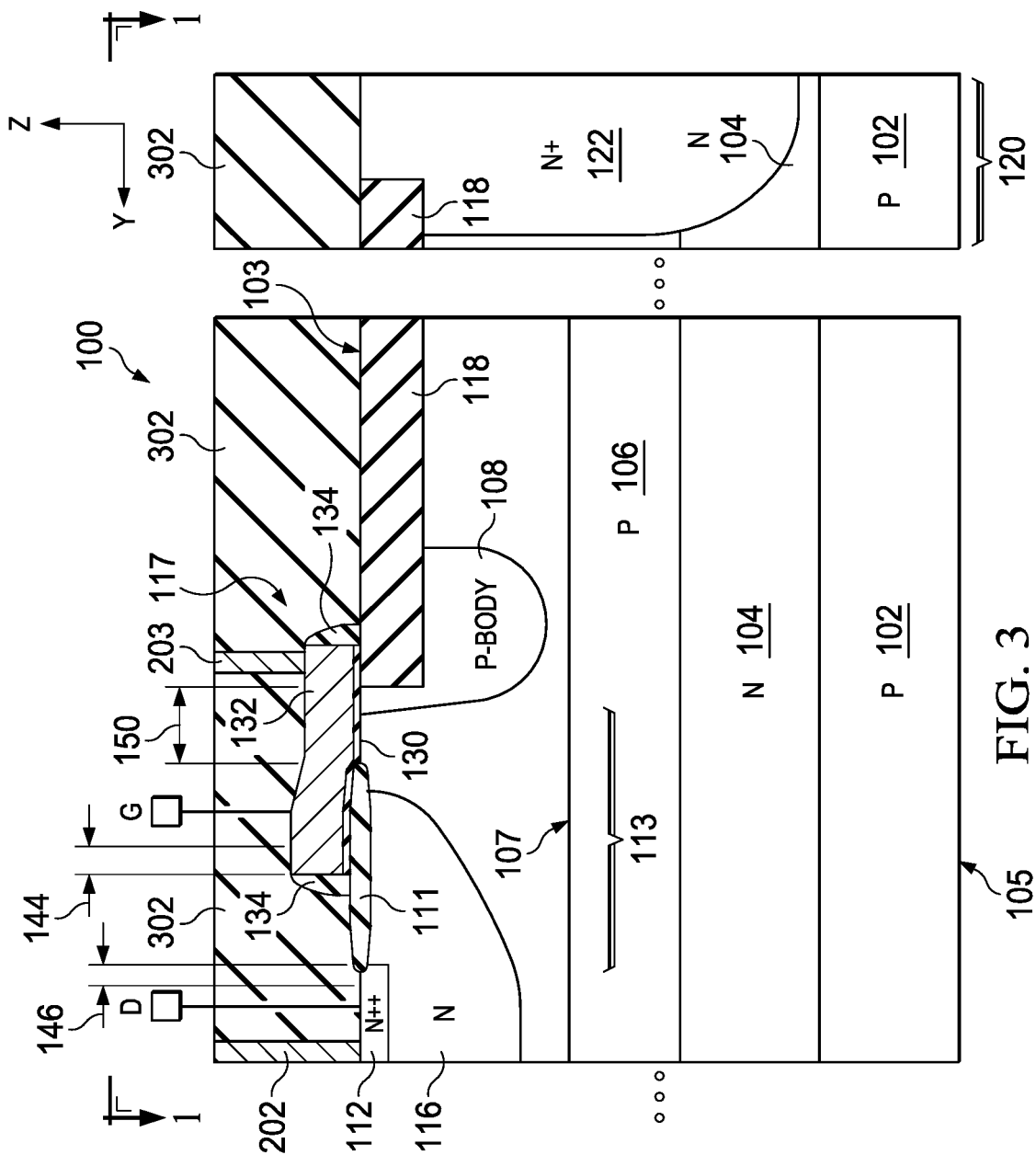
FIG. 3 is a partial sectional side elevation view of the integrated circuit along line 3-3 of FIG. 2.

Referring initially to FIGS. 1-3, FIG. 1 shows a partial side view of an integrated circuit (IC) 100 with a drain extended transistor 101 fabricated from a semiconductor substrate 102. FIG. 2 shows a partial top view of the IC 100 and a portion of the transistor 101, and FIG. 3 shows a partial end view of an end-cap portion of the transistor 101 in the IC 100. In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to". Drain extended transistors can include drain-extended NMOS (DENMOS), drain-extended PMOS (DEPMOS), and/or laterally diffused MOS (LDMOS) transistors, as well as groups of DENMOS and DEPMOS, referred to as complimentary drain extended MOS or DECMOS transistors. Described examples include doped regions of various semiconductor structures which may be characterized as p-doped and/or n-doped regions or portions, and include regions that have majority carrier dopants of a particular type, such as n-type dopants or p-type dopants.

The illustrated transistor 101 is an n-channel drain extended transistor (e.g., DENMOS). Other implementations are possible within the scope of the present disclosure, including p-channel drain extended transistor examples (e.g., DEPMOS) using oppositely doped structures and regions. In one example, the substrate 102 is a p-doped silicon substrate or wafer, with a first (e.g., top) side 103, various buried layers 104, 106 formed therein, and a second (e.g., bottom) side 105. In another possible implementation, the substrate 102 includes one or more epitaxial silicon layers (not shown) formed on a top surface, with one or more of the buried layers 104, 106 in epitaxial layers of the substrate. The illustrated substrate 102 includes a first doped layer 106 that includes p-type majority carrier dopants. In one implementation, the p-type layer includes a portion implanted with boron to form a p-type buried layer (PBL) with an upper or top side 107, and a further p-doped portion that extends over (e.g., directly on) the p-type buried layer to form the upper side 103 and to provide a composite p-doped first layer 106.

The example substrate 102 in FIG. 1 also includes a second doped layer 104 (e.g., an n-type buried layer or NBL) that includes n-type majority carrier dopants. The second doped layer 104 extends along a first direction (e.g., the vertical Z direction in FIG. 1) from beneath the first doped layer 106 toward the second side 105. In one example, a first epitaxial silicon layer is formed over the upper surface of a silicon wafer, and all or a portion of the first epitaxial layer is implanted with n-type dopants (e.g., phosphorus, etc.) to form the n-type buried layer. In this example, a second epitaxial silicon layer is formed over the first epitaxial layer, and all or a portion of the second epitaxial layer is implanted with p-type dopants (e.g., boron, etc.) to form the p-type buried layer with the upper side 107. In one example, the PBL region is formed using ion implantation through the final silicon surface (e.g., the top of the second epitaxial layer), with a depth set by using a high implantation energy.

The example IC 100 includes an n-channel drain extended transistor 101 (e.g., a DENMOS field effect transistor) with a drain-centered configuration. In other examples, a p-channel drain extended transistor (e.g., a DEPMOS) can be constructed as described below, having oppositely doped structures and regions. The example transistor 101 includes a body region 108 having p-type majority carrier dopants. The body region 108 extends along the Z direction into the first doped layer 106 from the first side 103. The body region 108 includes a channel portion 109 that extends to the top side 103 of the substrate 102. The transistor 101 also includes a source region 110 that extends along the Z direction into the first doped layer 106 from the first side 103. The source region 110 extends laterally along an orthogonal second direction (e.g., the X direction in FIG. 1) adjacent a first (e.g., inner) side of the channel portion 109 of the body region 108. The source region 110 in the illustrated n-channel transistor includes n-type majority carrier dopants (e.g., labeled N++ in the drawings).

The transistor 101 in FIG. 1 has an extended drain structure that includes an oxide structure 111 (e.g., field oxide) that extends along the first side 103 to provide a field gap for a laterally diffused extended drain. The example drain-centered transistor 101 includes gate and source structures that extend laterally around a drain region 112, although not a requirement of all possible implementations. The oxide structure 111 laterally encircles the drain region 112. The oxide structure 111 includes a first end (e.g., an outer end) spaced along the X direction from the channel portion 109 of the body region 108, as well as a second (e.g., inner) end. The transistor 101 further includes a drain region 112 that extends along the Z direction into the first doped layer 106 from the first side 103. The drain region 112 includes a first end adjacent the second end of the oxide structure 111 and n-type majority carrier dopants (e.g., labeled N++ in the drawings). In the illustrated example, the field oxide structure 111 is a local oxidation of silicon (LOCOS) structure.

The extended drain structure includes a drift region 113 with a first drift region portion 114 (e.g., connection portion, labeled N+ in the drawings). The first drift region portion 114 extends along the Z direction into the first doped layer 106 from the first side 103, and extends laterally along the X direction from the channel portion 109 of the body region 108 to the first end of the oxide structure 111. The first drift region portion 114 includes n-type majority carrier dopants having a first dopant concentration. In certain examples, the dopant concentration of the first drift region portion 114, and concentrations of other regions in the IC 100, can be profiled and can vary within a range. In the illustrated example, the drift region 113 also includes a second drift region portion 116 (e.g., labeled N in the drawings) that includes n-type majority carrier dopants having a second dopant concentration less than the first dopant concentration. The second drift region portion 116 extends between the first drift region portion 114 and the drain region 112. In one example, all or at least a portion of the oxide structure 111 extends between the second drift region portion 116 and the first side 103 along the Z direction. The second drift region portion 116 extends laterally along the X direction from the first drift region portion 114 to the drain region 112.

The example transistor 101 also includes a gate structure 117 that extends at least partially over the channel portion 109 of the body region 108. The illustrated IC 100 further includes isolation features, including an outer oxide structure 118 that encircles the transistor 101 along the first (e.g., top) side 103. The oxide structure 118 in one example is a shallow trench isolation (STI) structure, which is disposed laterally outward of the source region 110. In the illustrated example, the STI structure 118 defines an end of an active region of the semiconductor substrate 102 in which the transistor 101 is formed. The example STI structure 118 in one example is adjacent to an isolation structure 120 that encircles or surrounds the transistor 101 and the active region of the IC 100. The isolation structure 120 includes a deep n-doped region 122 (e.g., labeled N+) that extends laterally outward of the active region.

In another implementation, the isolation structure can be a deep trench structure with doped sidewall structures (not shown) that extend from the top side 103 of the substrate 102 through the PBL region 106, and into the NBL region 104. In certain examples, the isolation structure includes sidewall structures (not shown) on opposite lateral sides of deposited field oxide structures (not shown) that extend into the lower portion of the p substrate 102 beneath the NBL layer 104. The field oxide structures in this example laterally surround a P+ implanted silicon structure (not shown) that also extends from the first side 103 into the p substrate 102 below the NBL region 104. In one example, the IC 100 further includes contact structures (not shown in FIG. 1) that provide electrical connection to one or more features of the transistor 101, along with a metallization structure (not shown) that covers the transistor 101 and provides internal and/or external electrical interconnection to the transistor source, drain and gate terminals, respectively designated S, D and G in FIG. 1. The metallization structure can include a pre-metal dielectric (PMD) material formed over the illustrated structure, with contact structures formed therein to provide electrical interconnection access for further upper metallization layers (not shown).

The example gate structure 117 laterally encircles the drain region 112. The illustrated gate structure 117 includes a gate dielectric layer 130 formed over the first side 103 of the substrate 102, a gate patterned electrode 132 (e.g., polysilicon) on the gate dielectric layer 130, and lateral sidewall spacers 134 along lateral sides of the patterned gate electrode 132. The gate structure 117 provides an effective channel length 136 (Leff) of the drain extended transistor 101 from a first end of the gate electrode 132 to an inner side of the channel portion 109 along the X direction. The example transistor 101 also includes a p-type body contact region 140 laterally adjacent to the source region 110 to provide an electrical connection to the body region 108 (labeled P++ in FIG. 1).

In the example IC 100 of FIGS. 1-3, the transistor 101 includes a protection layer 142 that extends on the oxide structure 111 between the gate structure 117 and the drain region 112. In one example, the protection layer 142 includes an oxide material. In another example, the protection layer 142 includes a nitride material. In one example, the protection layer 142 includes an oxynitride material. As described further below in connection with FIGS. 4, 16 and 17, the protection layer 142 in one example is a silicide block material that mitigates or prevents silicidation of the oxide material 111 during deglazing and other operations during and after silicide contact formation during fabrication of the IC 100. The protection layer 142 in this example can be used to concurrently protect the oxide structure 111 and to provide control of silicide formation in other components of the IC 100, such as a resistor component fabricated in the IC 100 (e.g., FIG. 28 below). In this example, no additional masks or processing steps are needed to provide the protection layer 142 in the transistor 101 during fabrication of the IC 100.

In one example, the protection layer 142 extends on a portion of (e.g., overlaps) the gate structure 117 by a distance 144 as shown in FIG. 1. In one example, the distance 144 is 30 nm or more. The protection layer 142 in the illustrated example also extends on (e.g., overlaps) a portion of the drain region 112 by a distance 146. In one example, the distance 146 is 30 nm or more. As shown in FIG. 1, the STI structure 118 is laterally spaced from the field oxide (LOCOS) structure 111 by a distance 150 along the X direction.

FIG. 2 shows a top view of a portion of the IC 100 in the X-Y plane taken along line 2-2 in FIG. 1. In this example, the isolation structure 120 laterally surrounds the active region of the semiconductor substrate 102. The isolation structure 120 in this example includes the STI structure 118, and an implanted p-type well structure, such as a portion of the p-body implanted region 108. The STI structure 118 extends on the right in the partial view of FIG. 2, and defines an end of the active region of the semiconductor substrate 102. FIG. 2 shows the IC 100 with a metallization structure that includes source contacts 201 on either side of centrally disposed drain contacts 202 in the example drain-centered configuration. FIG. 3 illustrates a pre-metal dielectric (PMD) layer 302 formed over the transistor 101 and over the top side 103 of the substrate. The illustrated portion of the IC 100 in FIG. 3 includes example drain and gate conductive contacts 202 and 203 (e.g., tungsten), respectively, that extend from the corresponding drain structure 112 and gate structure 132 to the top surface of the PMD layer 302. The top view of FIG. 2 and the end view of FIG. 3 illustrate an end cap structure of the transistor. The end cap structure includes gate contacts 203 that are electrically connected to a first portion of the gate electrode 132 outside the active region of the semiconductor substrate 102. As shown in FIGS. 2 and 3, the example STI structure 118 is laterally spaced from the field oxide (LOCOS) structure 111 by the distance 150 along the Y direction that is substantially perpendicular to the X direction. In one example, the first distance 150 is 0.5 μm or more.

As shown in FIGS. 1 and 2, the drain extended transistor 101 in one example includes multiple substantially parallel transistor fingers that extend along the Y direction. The individual transistor fingers include a source finger that extends in the active region of the semiconductor substrate 102 between a first finger end and a second finger end along the Y direction. The individual transistor fingers also include a drain finger that extends in the active region of the semiconductor substrate 102 between the first finger end and the second finger end along the Y direction, and a gate finger that extends along the Y direction Y. The gate contact 203 is electrically connected to a first portion of the gate electrode 132 outside the active region of the semiconductor substrate 102, as shown in FIGS. 2 and 3. The source region 110 in this example includes a plurality of the source fingers, and the drain region 112 includes a plurality of the drain fingers. In this example, the gate structure 117 includes a plurality of the gate fingers, and the gate structure 117 extends beyond the first transistor end along the Y direction outside the active region of the semiconductor substrate 102. Also, the first portion of the gate electrode 132 is above the STI structure 118. This facilitates fabrication of the gate contact structures 203 above the shallow trench isolation structure 118 and mitigates formation of silicide grain boundary that could adversely interact with a contact etch chemistry and punch through a thinner oxide. The spatial relationship between the STI structure 118 and the LOCOS field oxide structure 111 facilitates improved production yield, compact layout, and low gate capacitance.

Figure 4:
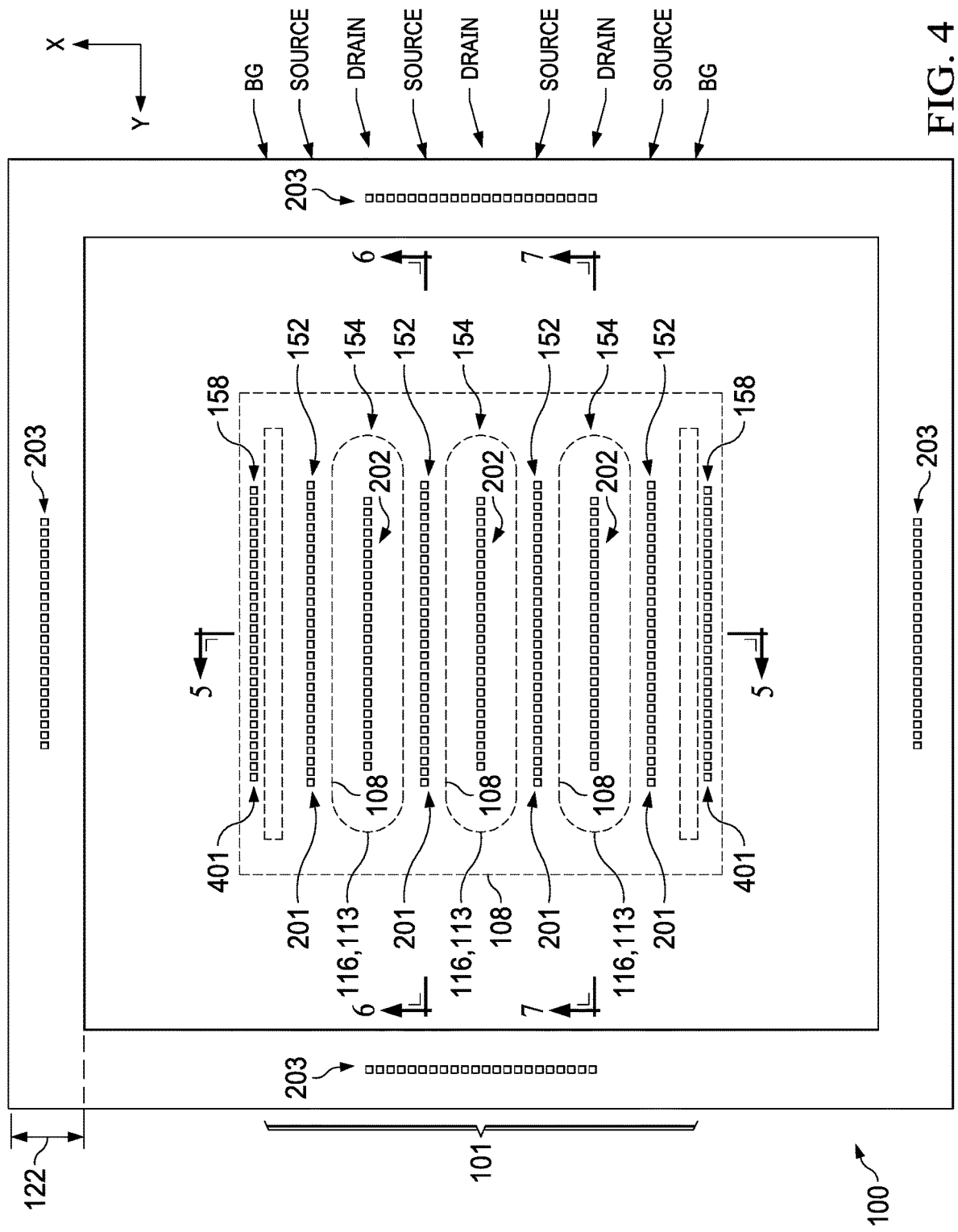
FIG. 4 is a partial top plan view of a drain-centered multi-finger drain extended transistor in the IC of FIGS. 1-3.
Figure 5:
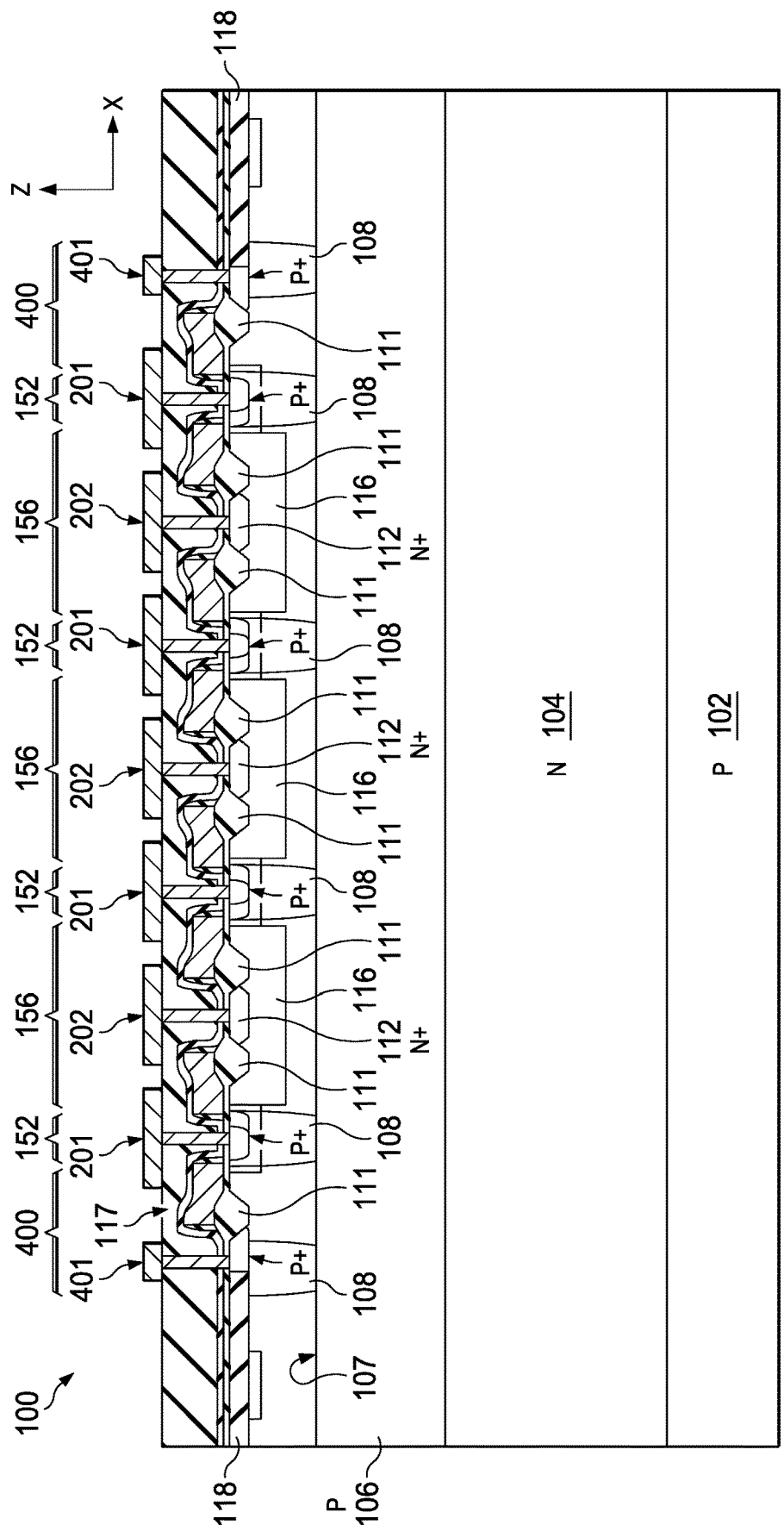
FIG. 5 is a partial sectional side view showing a length-direction section of the drain extended transistor taken along line 5-5 of FIG. 4.
Figure 6:
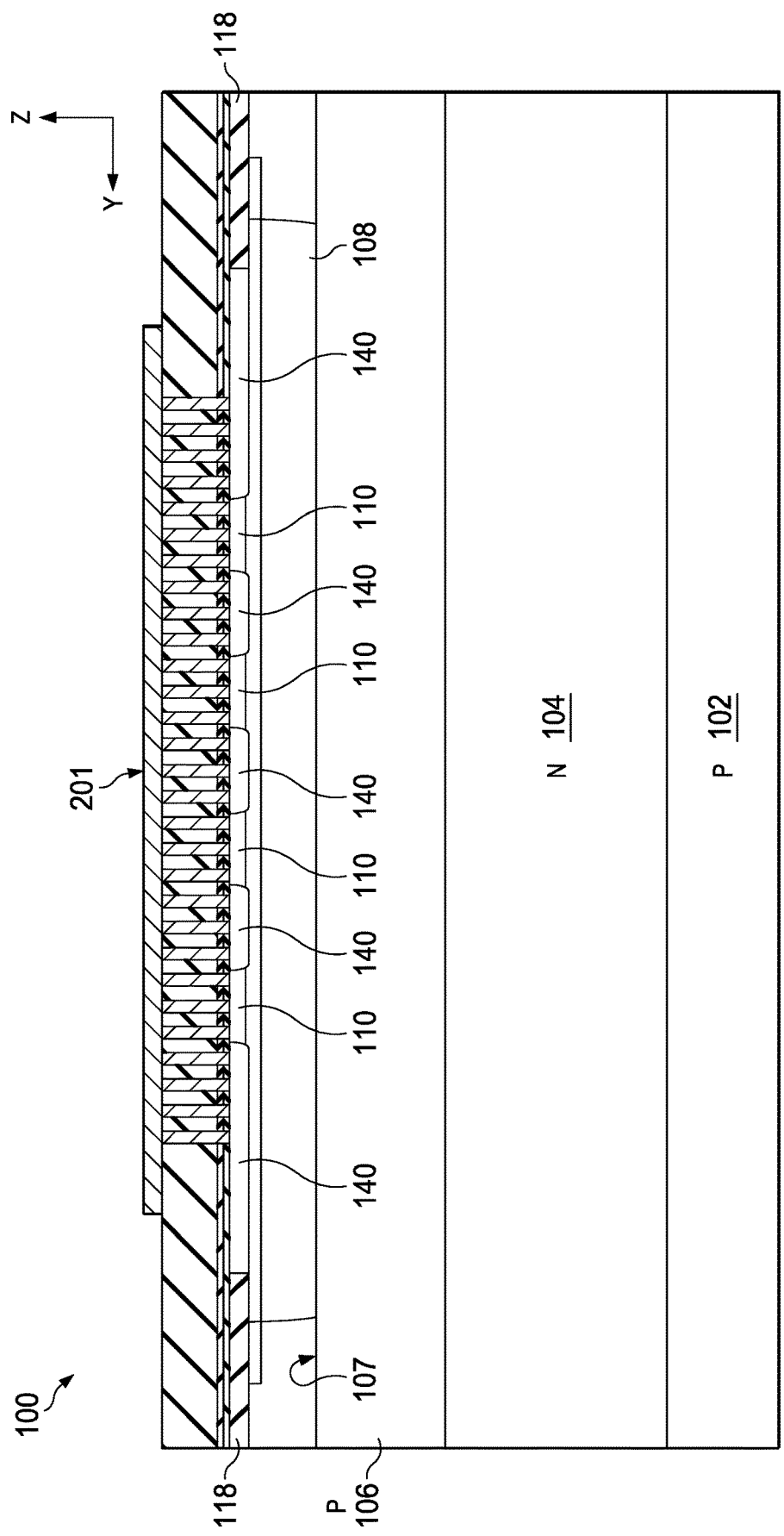
FIG. 6 is a partial sectional side view showing a width-direction section of the drain extended transistor taken along line 6-6 of FIG. 4.
Figure 7:
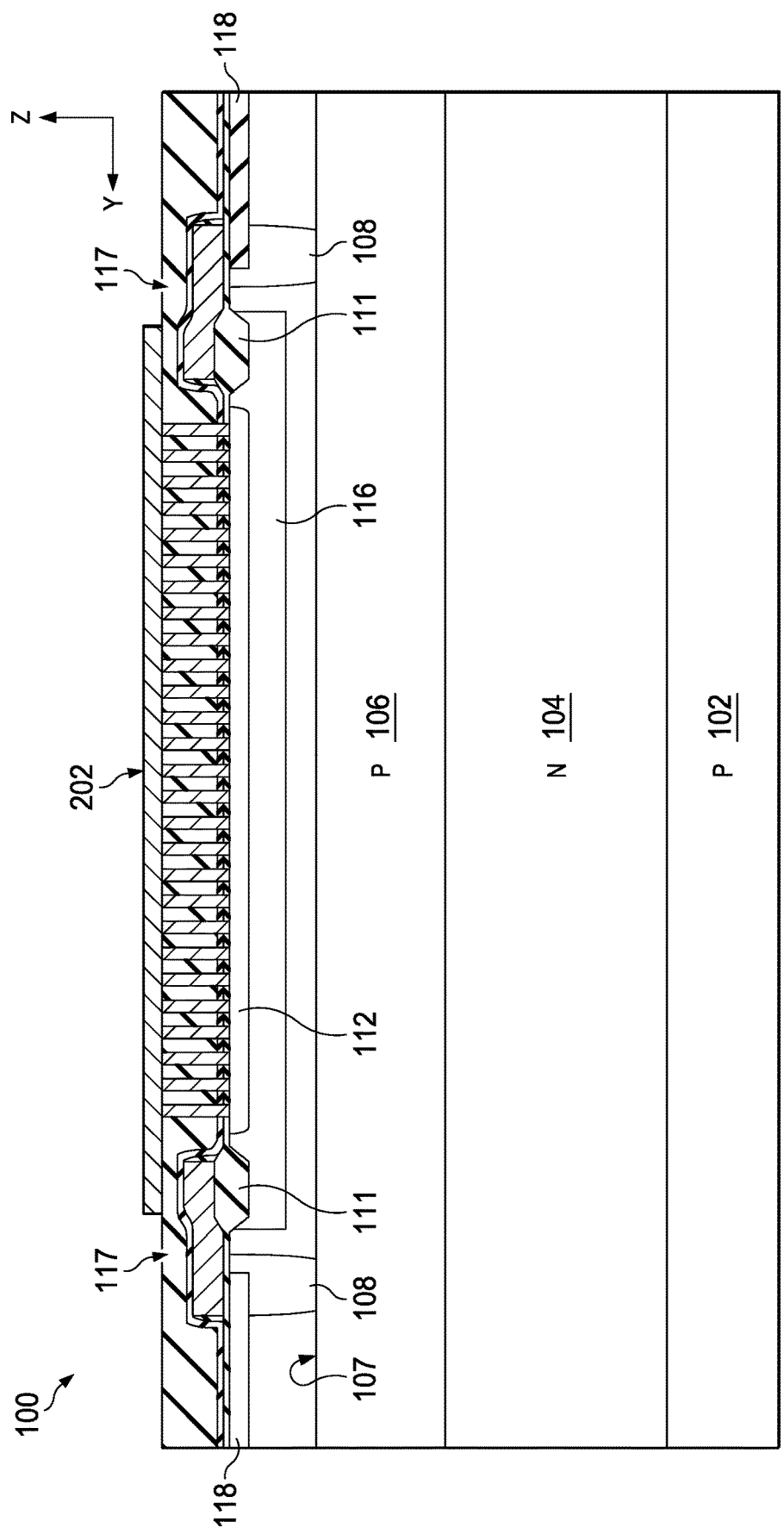
FIG. 7 is a partial sectional side view showing a width-direction section of the drain extended transistor taken along line 7-7 of FIG. 4.

Referring also to FIGS. 4-8, FIG. 4 shows a partial top plan view of an example of the drain-centered multi-finger drain extended transistor 101 in the IC 100 of FIGS. 1-3. FIG. 5 shows a length-direction section view of the drain extended transistor 101 taken along line 5-5 of FIG. 4. In addition, FIG. 6 shows a partial width-direction sectional side view of the transistor 101 taken along line 6-6 of FIG. 4, and FIG. 7 shows a partial width-direction sectional side view of the transistor 101 taken along line 7-7 of FIG. 4. The example transistor 101 in FIGS. 4-8 includes a drain-centered configuration of substantially parallel transistor finger structures 151, 152, 153, 154, 155, 156, 157, and 158. The transistor finger structures 151-158 are formed in an active region of the substrate 102, and the active region is isolated from other portions of the IC 100 by an isolation ring structures, which can be circular, rectangular, or any suitable shape. In the example of FIG. 4, the active region is surrounded by a rectangular isolation structure 122, best shown in the top view of FIG. 4. In this example, gate contact structures 203 are formed around the illustrated four sides of the transistor 101 above the isolation structure 122. In this example, the transistor finger structures include body region fingers 151, source fingers 152, oxide fingers 153, drain fingers 154, drift region fingers 155, and gate fingers 156. In this example, moreover the transistor 101 includes protection layer fingers 157 and body contact fingers 158.

As best shown in FIGS. 1 and 4, the individual body region fingers 151 include a body region 108 implanted portion that extends into the substrate 102 along the Z direction, and includes p-type majority carrier dopants of a first type P and the channel portion 109 as described above in connection with FIG. 1. The individual source fingers 152 include a n-doped source region 110 that extends along the Z direction into the substrate 102 adjacent the first side of the channel portion 109 of the body region 108. The individual drain fingers 154 include an n-doped drain region portion 112 that extends into the substrate 102 with a first end adjacent the second end of the oxide structure 111. The individual oxide fingers 153 include an oxide structure 111 that extends along the first side 103 of the substrate 102 with a first end spaced along the X direction from the channel portion 109. The individual drift region fingers 155 include an n-doped drift region 113 with n-type majority carrier dopants. The drift region 113 of the individual fingers 155 extends along the Z direction into the substrate 102 from the first side 103, and extends along the X direction from the channel portion 109 of the associated body region 108 to the associated drain region 112. In addition, the example drift region fingers 155 include a portion 116 that is separated from the first side 103 along the Z direction by at least a portion of the associated oxide structure finger 111. The individual gate fingers 156 include a gate structure 117 with a gate dielectric layer 130 and a gate electrode 132 on the gate dielectric layer 130 at least partially above the channel portion 109 of the body region 108, as best shown in FIG. 1. In one example, as shown in FIG. 4, one of the drain fingers 154 is positioned at a center of the drain extended transistor 101 along the X direction.

The individual body contact fingers 158 in this example include a p-doped body contact region 140 laterally adjacent to the source region 110 to provide an electrical connection to the body region 108. In this example, two of the plurality of body contact fingers 158 are at outer ends of the drain extended transistor 101 along the X direction, as best shown in FIG. 4. In addition, the example transistor 101 in FIG. 1 includes p-doped regions 160, such as deep well implanted regions used for low-voltage components in other areas of the IC 100 (not shown). As shown in FIGS. 4 and 5, contacts 401 are provided for integrated back gate connection of the transistor 101 in upper metallization layers. In this example, the body contact region 140 is electrically connected to the body region 108. In addition, the body region 108 laterally surrounds the drain region 112 along the X and Y directions, and the finger structures 151-158 are substantially parallel to one another along the Y direction.

Described examples include drain-centered LDMOS layouts or extended drain transistor configurations. The drain-centered configuration in one example includes an integrated p-type guard ring with a source-back gate portion of the transistor 101, that facilitates reducing the perimeter area, and hence the overall substrate area occupied by the transistor 101. In other approaches to LDMOS fabrication, the integrated source/back gate region is in the center of a gate polysilicon racetrack layout and the drain is outside the POLY gate. For an NMOS high-side device in a DC-DC converter application, an n-type isolation tank (e.g., NISO) can be tied to the drain to facilitate a compact layout. However, for efficient switching operation, the NISO is typically grounded to the source/back gate terminal. In this case, the drain is isolated from the NISO, but creating such an isolated LDMOS typically requires significant area to provide a p-type guard ring around the LDMOS drain to mitigate punching through to the NISO, particularly in high-current conditions. Disclosed examples provide an area-efficient isolated LDMOS layout that mitigates or avoids these problems. In particular, high-side functionality can be recovered in the example IC 100 by electrically connecting the drain terminal to the NISO terminal through metal layer interconnections.

Referring to FIGS. 8-16, various top plan views are hereinafter presented with certain features shown in dashed lines and other features omitted for clarity. In the drawings, certain implanted regions or other structural features may include generally continuous features with openings, wherein certain of these are shown with reference numerals showing inner and outer sides or boundaries of a feature to indicate outer extents and openings (e.g., p-type implanted body regions 108 in FIGS. 8-12, polysilicon structures 132 in FIGS. 13-15, LOCOS features 111 in FIG. 16, etc.

Figure 8:
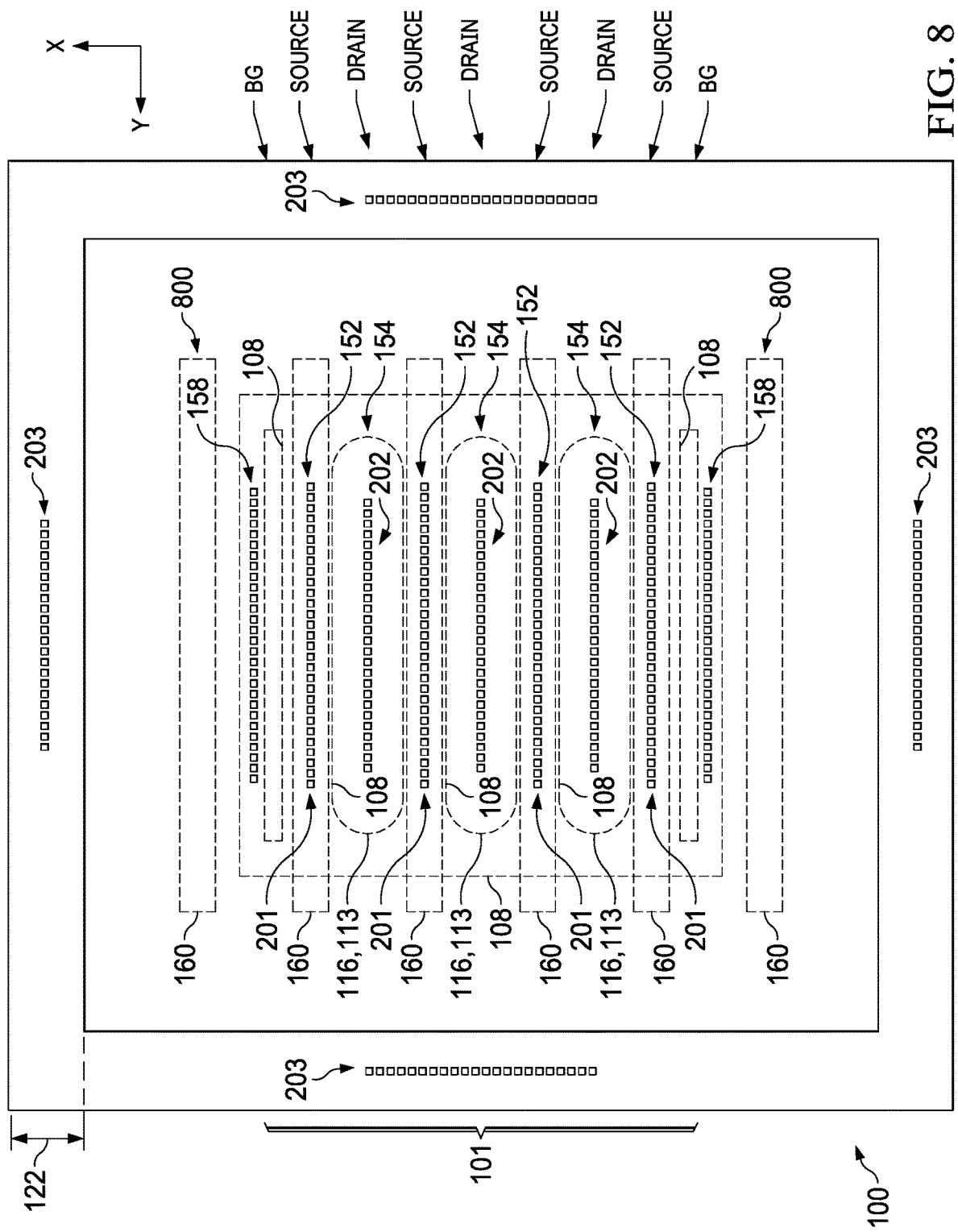
FIG. 8 is a partial top plan view of another example drain-centered multi-finger drain extended transistor with dummy deep well implant stripes to relieve stress in the photoresist during fabrication.

FIG. 8 shows another example implementation of the drain-centered multi-finger drain extended transistor 101. This example includes inactive (e.g., electrically inert) or dummy shallow well implant stripes 800 at the lateral ends of the multi-finger transistor structure. The example dummy structures 800 are formed together with the active stripes of the deep well implants 160. During fabrication, the presence of the dummy structures 800 facilitates reduced stress on photoresist blocks during fabrication. In particular, the dummy fingers or stripes 800 in this example relieve stress in photoresist blocks to keep profiles uniform, and help maintain pitch or finger-spacing in a device array. In one example, the strips 800 extend beyond the active region (e.g., moat) by 0.5-2 where the moat boundary in one example is set by the inner edge of the shallow trench isolation (STI) structure 118. In addition, the stripes 800 in one example prevent or mitigate finger-end curvature effects, and make the photoresist profile for the active region features 600 more uniform across the array, particularly at edges thereof.

Figure 9:
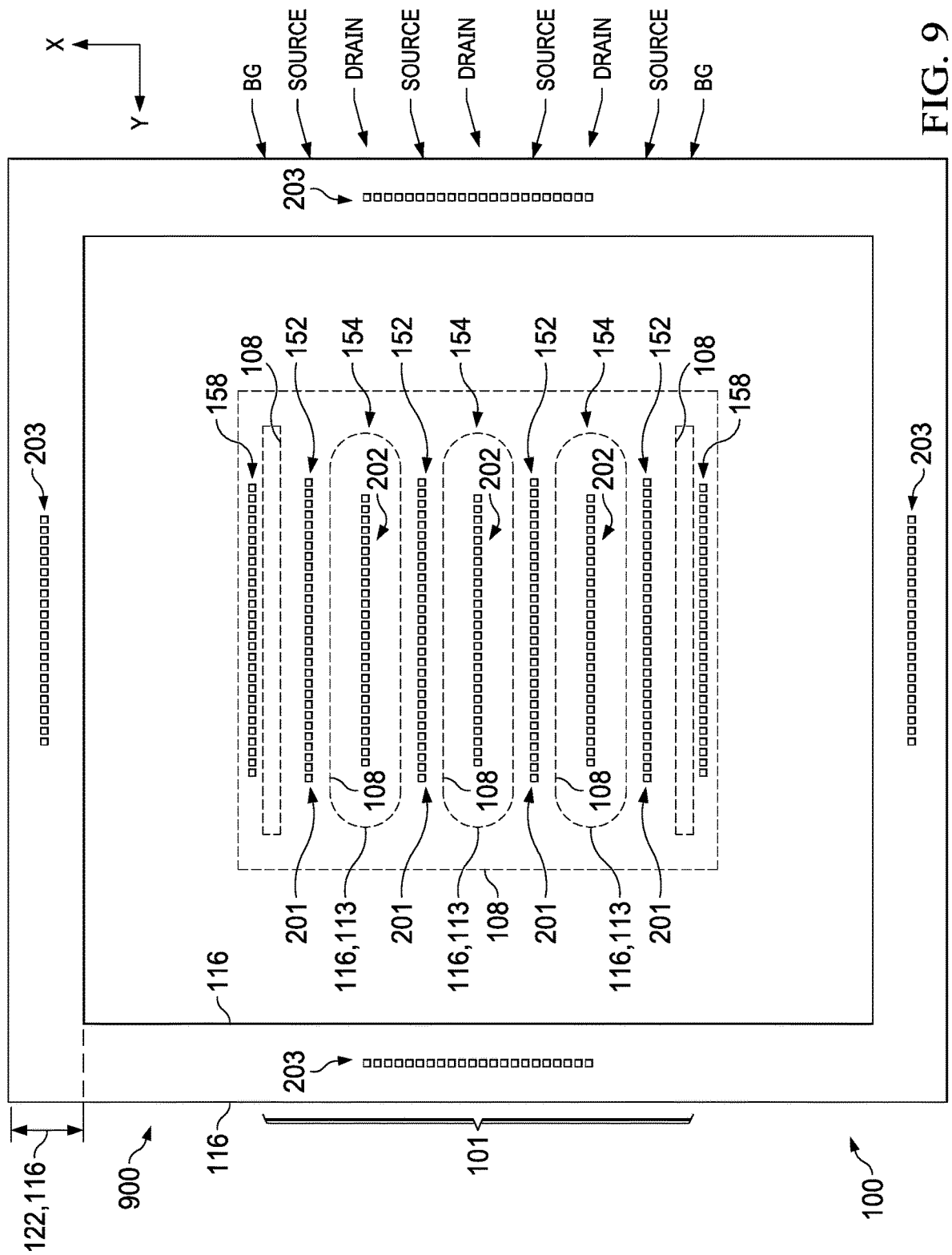
FIG. 9 is a partial top plan view of another example drain-centered multi-finger drain extended transistor with dummy drift region implant stripes to relieve stress in the photoresist during fabrication.

FIG. 9 shows a top view of another example implementation of the transistor 101, which includes dummy drift region implant stripe 900 that helps to relieve stress in the photoresist during fabrication. This example includes an outer n-doped drift region 900 that laterally surrounds the active region of the substrate 102 along the X and Y directions. In one implementation, as shown in FIG. 9, the implant stripe 900 is generally coextensive with the previously described isolation structure 122, and is formed by n-type dopant implantation during implantation of the n-type drift region fingers 116. This supplemental implantation of n-type dopants to the NISO ring helps break up the large region of drift region photoresist outside the active LDMOS area, and facilitates reduced stress and hence improves uniformity of drift region patterning inside the LDMOS array. The stress relief of the extra ring of drift region implantation reduces the edge to center difference in photoresist profile. In one example, the drift region implantation (e.g., 116 in FIG. 1 above) is deep enough along the Z direction to penetrate the STI structure 118, and the drift region implantation 116 is located in one example within the active (e.g., moat) region. The supplemental implantation of the n-type dopants to the NISO ring in certain examples may also enhance electrical performance of the transistor 101.

Figure 10:
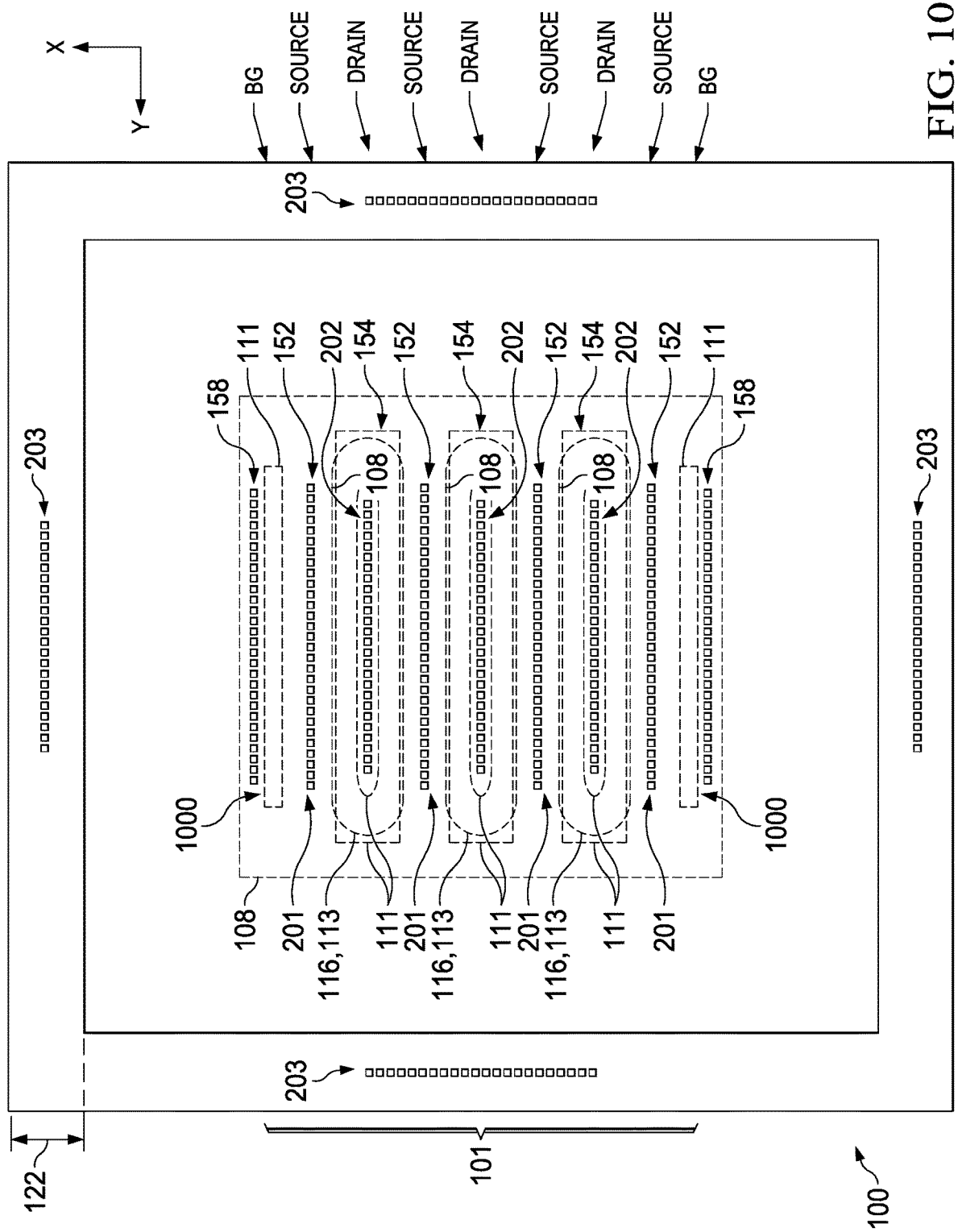
FIG. 10 is a partial top plan view of another example drain-centered multi-finger drain extended transistor with dummy locos stripes to relieve stress in the photoresist during fabrication.
Figure 11:
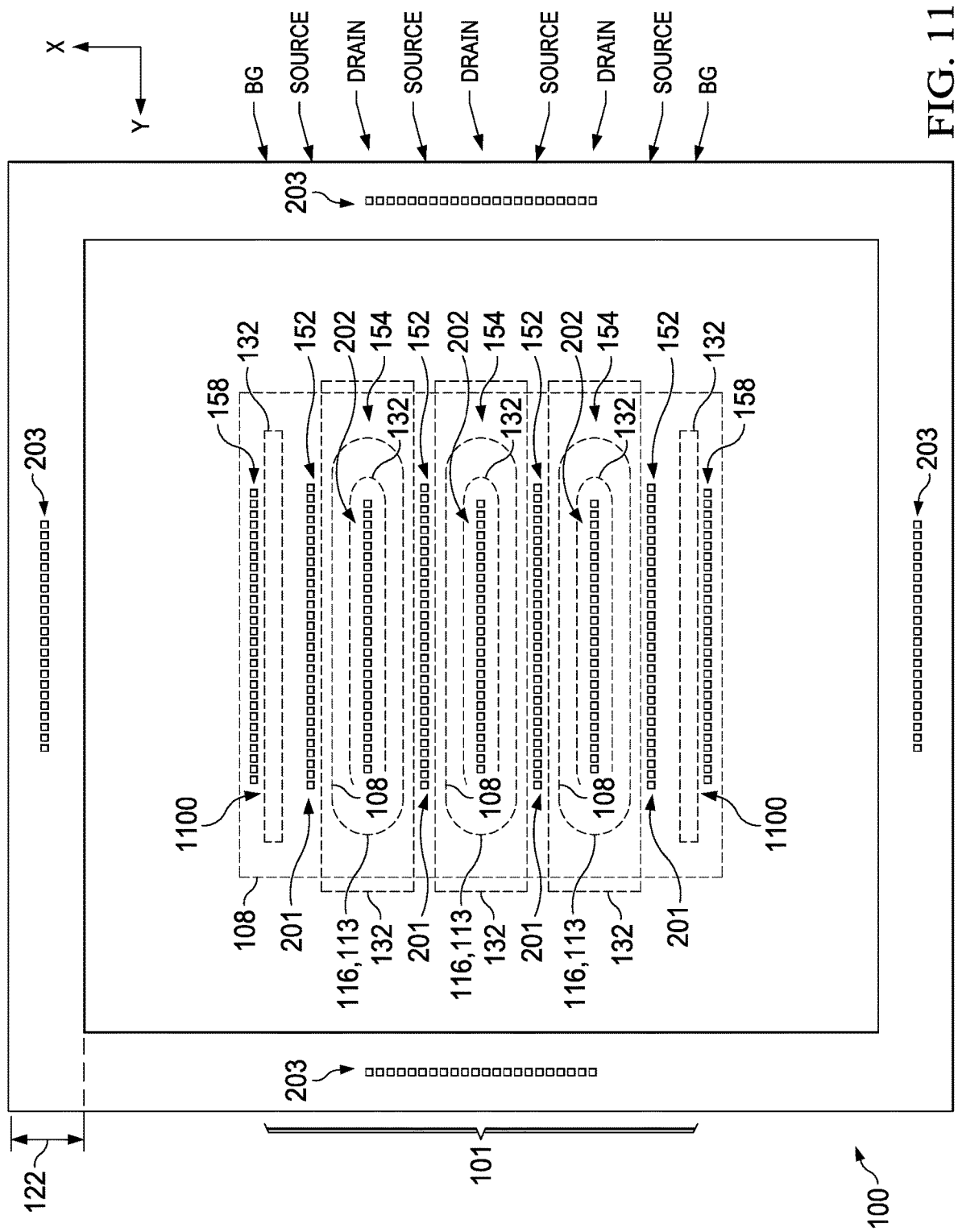
FIG. 11 is a partial top plan view of another example drain-centered multi-finger drain extended transistor with dummy polysilicon stripes to relieve stress in the photoresist during fabrication.
Figure 12:
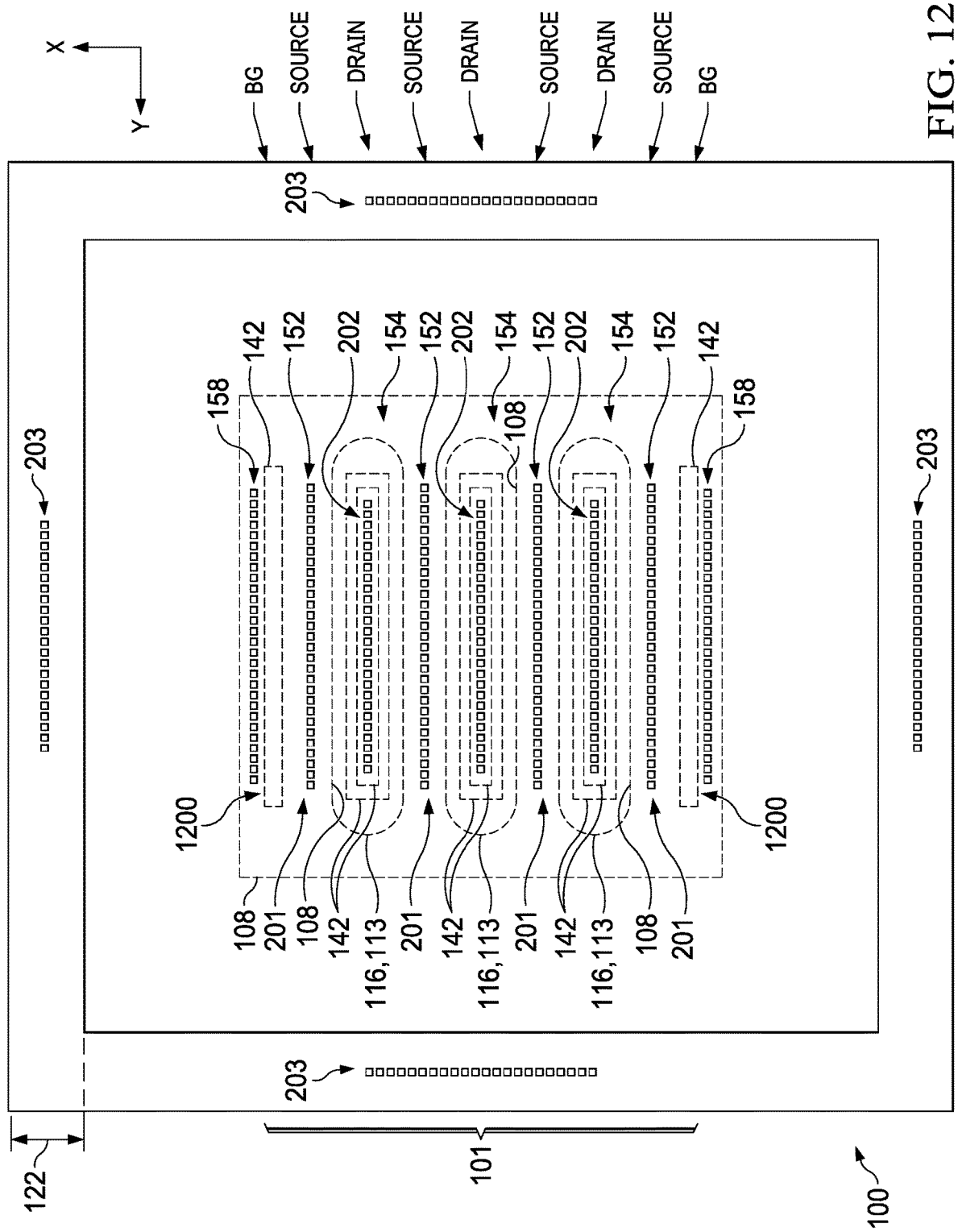
FIG. 12 is a partial top plan view of another example drain-centered multi-finger drain extended transistor with dummy protection layer stripes to relieve stress in the photoresist during fabrication.

Referring also to FIGS. 10-12, in certain examples, the IC 100 includes locos-based LDMOS dummy finger structures with polysilicon and oxide, and may further include a protection layer material, such as the silicide block protection layer 142. In certain examples, moreover dummy polysilicon finger structures are connected through metallization layer features (not shown) to facilitate grounding or other connection of the dummy polysilicon fingers to a reference voltage node (e.g., ground), in order to ground or deactivate the dummy polysilicon features. FIG. 10 shows an example implementation of the transistor 101 inactive oxide fingers 1000 (e.g., dummy locos stripes) to relieve stress in the photoresist during fabrication. In certain examples, inactive oxide fingers are outwardly spaced from the array of active transistor fingers, including feature widths that substantially match the drift length, such that the spatial relationship to source and drain openings matches the polysilicon fingers in the device array. In this example, the active (e.g., moat) region is sized in order to enclose the LOCOS oxide material 111 by approximately 0.5 µm. Certain examples make the stress field associated with the LOCOS oxide more uniform across the array, particularly on the end fingers.

FIG. 11 shows the transistor 101 with inactive gate electrode fingers 1100 (e.g., dummy polysilicon stripes) to relieve stress in the photoresist during fabrication. The inactive electrode fingers in one example are placed at finger ends of the transistor 101, and have dimensional widths that substantially match the polysilicon feature widths in the array. In one example, the spatial relationship to the source and drain openings matches the array polysilicon finger structures 132. In certain examples, as discussed above, the inactive or dummy polysilicon fingers 111 are connected through upper metallization layers (not shown) to allow connection to a ground or other reference voltage node.

FIG. 12 shows the transistor 101 with inactive or dummy protection layer fingers 1200 (e.g., silicide block stripes) to relieve stress in the photoresist during fabrication. The inactive or dummy structures 1000, 1100, and 1200 in FIGS. 10-12 can be used separately or in combination in various implementations. In one example, the inactive finger structures are located proximate each outer end of the drain extended transistor 101 along the X direction. The individual protection layer fingers 157 in FIG. 12 include a protection layer 142 that extends on the oxide structure 111 between the gate structure 117 and the drain region 112. As discussed above in connection with FIG. 1, the protection layer 142 in one example includes an oxide material and/or a nitride material. In certain examples, the silicide block material 142 of the inactive protection layer fingers 112 are located at the finger ends of the transistor 101, and include dimensional widths that are similar or matching to the protection layer structures 142 in the active fingers of the transistor 101. In one example, the relationship of source and drain openings in the active transistor fingers matches the protection layer structures 142 across the array, particularly at array edges.

Figure 13:
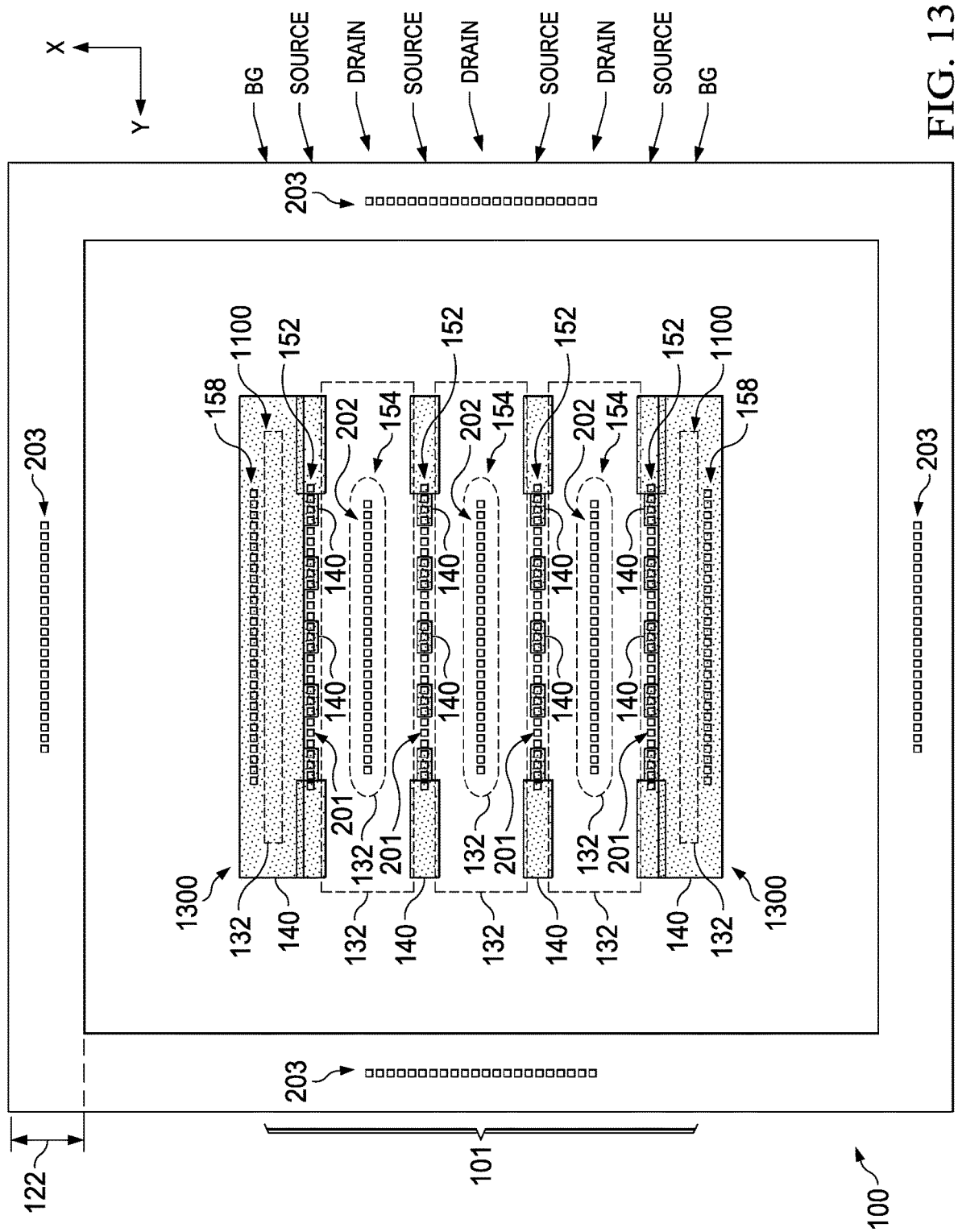
FIG. 13 is a partial top plan view of another example drain-centered multi-finger drain extended transistor with dummy p-type source/drain implant regions to relieve stress in the photoresist during fabrication.
Figure 14:
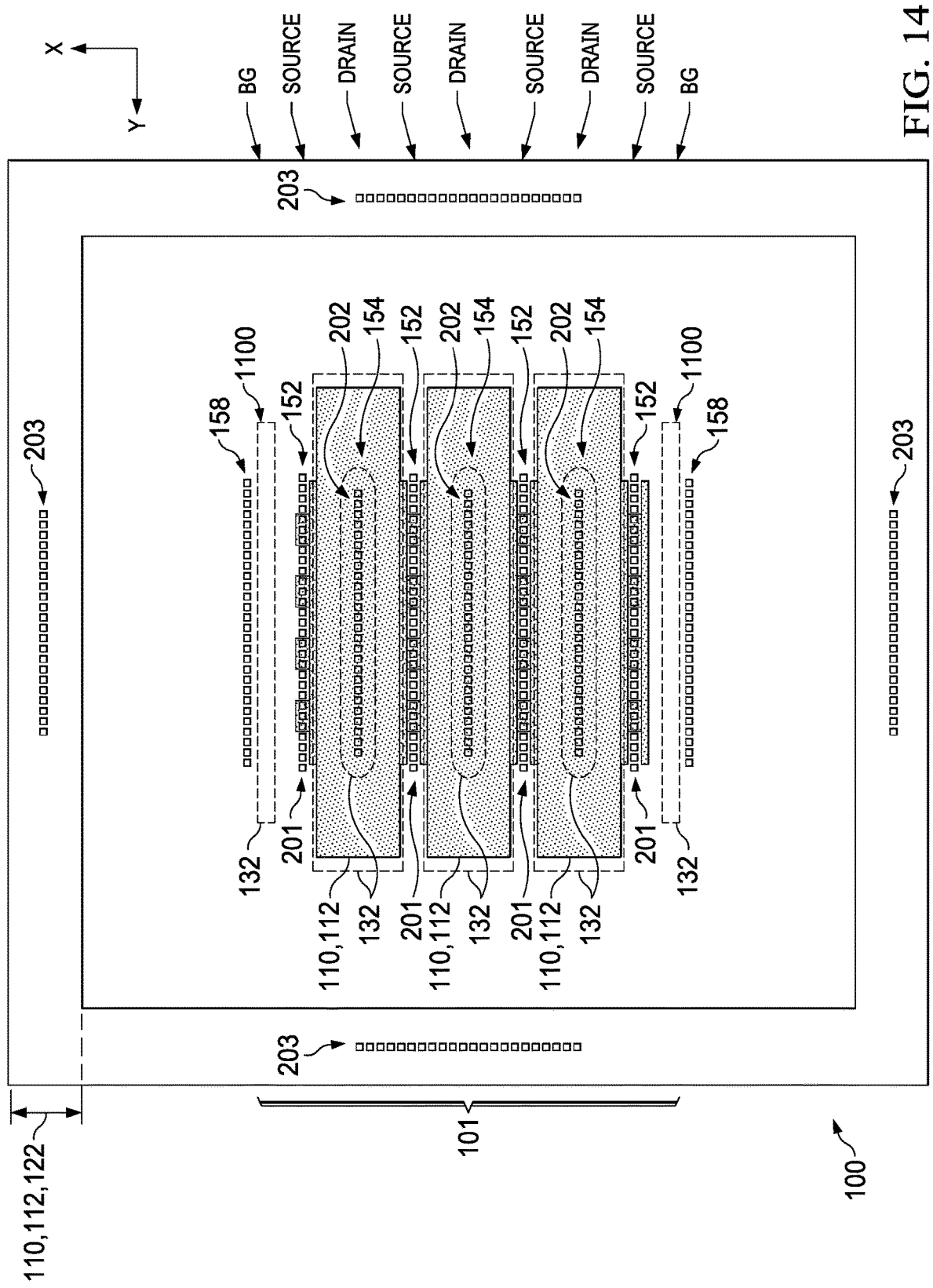
FIG. 14 is a partial top plan view of another example drain-centered multi-finger drain extended transistor with dummy n-type source/drain implant regions to relieve stress in the photoresist during fabrication.
Figure 15:
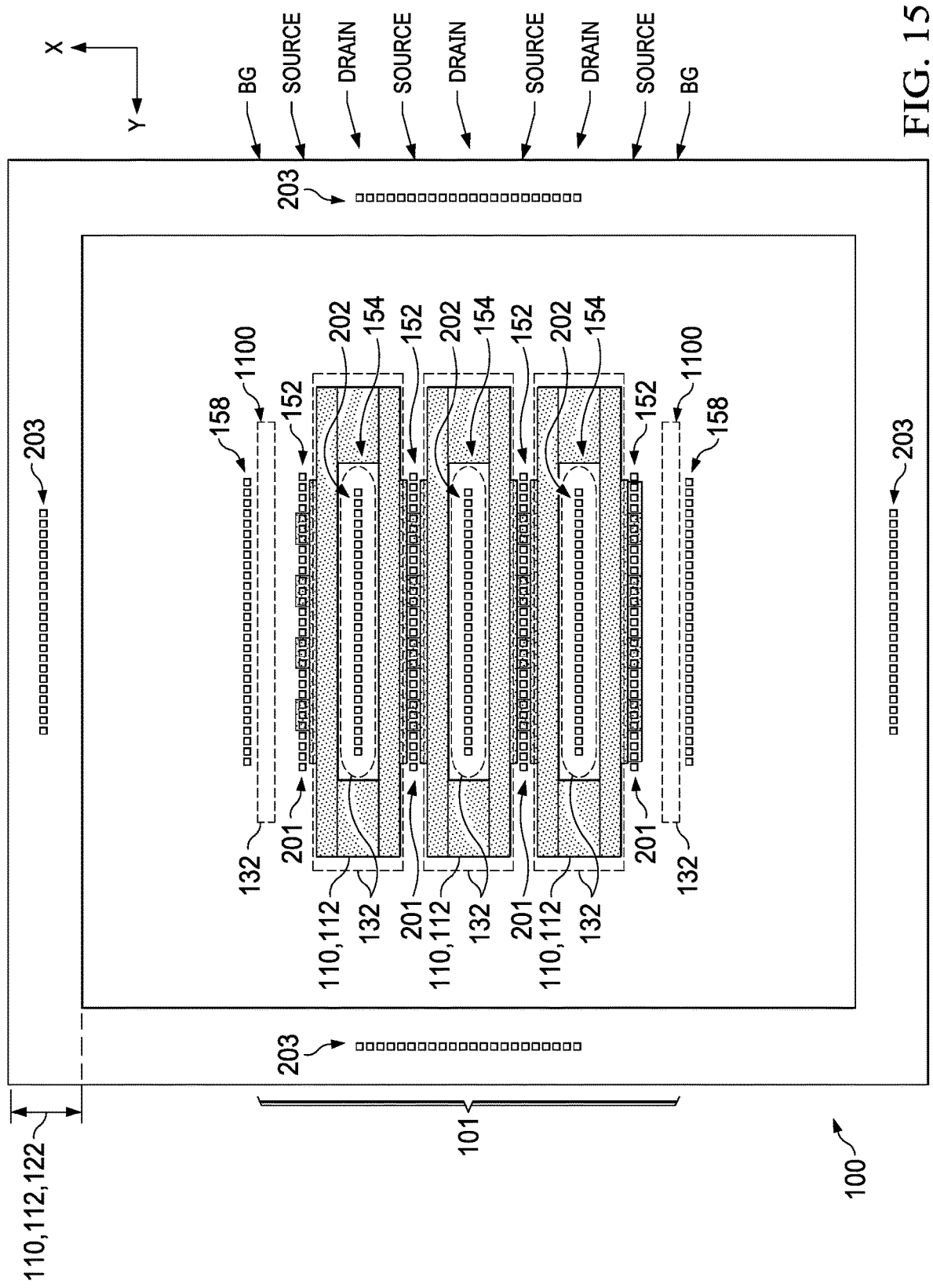
FIG. 15 is a partial top plan view of another example drain-centered multi-finger drain extended transistor with dummy n-type source/drain implant regions to relieve stress in the photoresist during fabrication.
Figure 16:
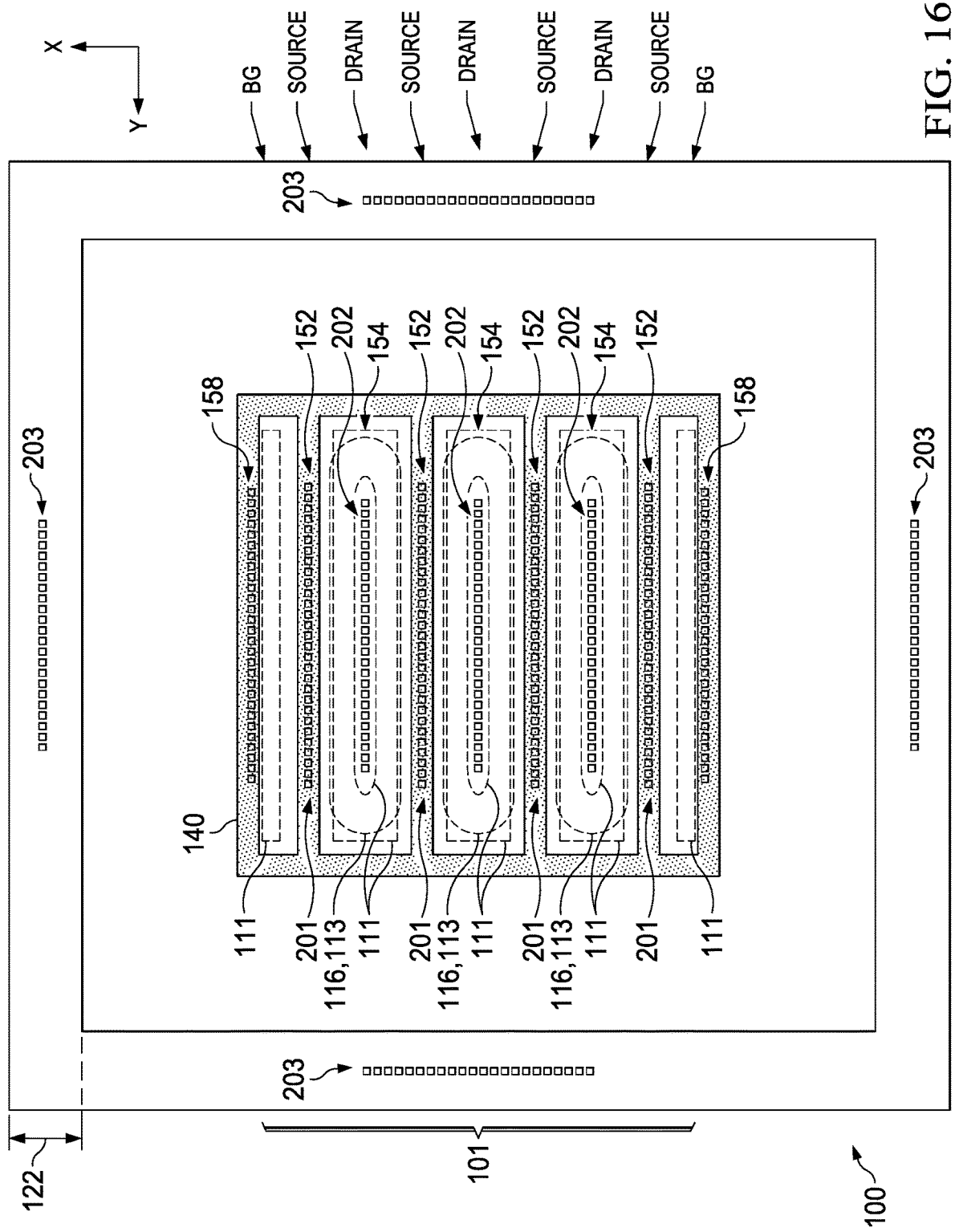
FIG. 16 is a partial top plan view of another example drain-centered multi-finger drain extended transistor with a dummy implanted well ring structure to isolate the transistor drift region.

Referring also to FIGS. 13-16, FIG. 13 shows a top view of another example implementation of the transistor 101, including p-type implanted regions 140 including two example inactive or dummy p-type source/drain implant regions 1300 to relieve stress in the photoresist during fabrication. FIGS. 14 and 15 show two example n-type dummy or inactive source/drain implant regions that can be provided in combination with the p-type implant regions 140 of FIG. 13. FIGS. 13-15 also show the polysilicon features 132 in dashed lines for reference. In addition, FIG. 16 shows an example with an inactive or dummy implanted well ring structure to isolate the transistor drift region. These features can be used separately or in combination in various implementations. The transistor 101 in the examples of FIGS. 13-15 include body contact fingers 158 at the outer ends of the transistor 101 along the X direction. The individual body contact fingers 158 include a p-doped portion of the body contact region 140 laterally adjacent to an outermost source region that provides an electrical connection to the body region 108. This example also includes inactive p-doped body contact regions 140 at lateral ends of the source fingers 152 along the Y direction and regions 140 around certain groups of three or four contacts of the source fingers 152. Moreover, the examples shown in FIGS. 14 and 15 include inactive n-doped source/drain implant regions or portions 110 and 112 at the lateral ends of the drain fingers 154 along the Y direction. The example of FIG. 14 includes a continuous implanted region 110, 112 that extends to the drain contacts 202, whereas the example of FIG. 15 includes a gap in the n-type implanted regions 110, 112 that laterally surrounds the drain contacts 202. In certain implementations, the n-source/drain implantations 110, 112 are also implemented in the deep n-type ring region 120 in the examples of FIGS. 14 and/or 15. In other examples, the n-source/drain implantations 110, 112 need not be done in the outer ring deep n-type region 120. In certain examples, the p-type implanted regions 140 (e.g., FIG. 13) cover the dummy fingers and make contact to a shallow p-well body contact ring structure 140 as shown in FIG. 16. The p-type implanted region 140 in FIG. 13 on the end fingers also breaks up the solid n-type source/drain implanted regions 110, 112 shown in FIGS. 14 and 15, making the edge finger characteristics more similar to the middle of the array. At the finger ends, moreover, the p-type regions 140 in FIG. 13 are implanted in one example to the active region (e.g., moat) to make contact to the shallow p-type body contact ring of FIG. 16.

As further illustrated in FIG. 16, one implementation of the transistor 101 also includes inactive n-doped drift regions 113 (e.g., at the lateral ends of the drain fingers 154 along the Y direction. In the particular example of FIG. 16, the p-doped body region 108 laterally surrounds the transistor 101 drain region 112 along the X and Y directions. In examples using the structures of FIGS. 13-15, the n-type source/drain regions 110 and 112, and the p-type back gate or source contact implanted features 140, can be used alone or in combination as inactive or dummy features. The p-type features 140 in one example make contact to the p-type body region 108, and the p-type features 140 at the finger ends serve to break up the solid n-type source/drain region, making the edge finger characteristics more similar to the middle of the array. In one example, the p-type source/drain implant region is formed into the active moat region to make contact to the p-type body contact ring 140. In one example, the p-type body features 108 are formed as minimum-width stripes, such as approximately 0.75 µm wide and form a lateral ring around each transistor 101 in an integrated circuit 100 to reinforce the body doping of the deep well implants 160. At the finger ends, the body implant regions 108 form a strong p-body tie that isolates each high voltage drift region of the transistor drain region from the N-ISO tank. In addition, the p-body stripes 108 at the finger edges extend the strong body tie around the full perimeter of the device 101. In one example, the p-body stripes 108 at the finger edges are broken into min-width stripes to maintain CD uniformity.

Figure 17:
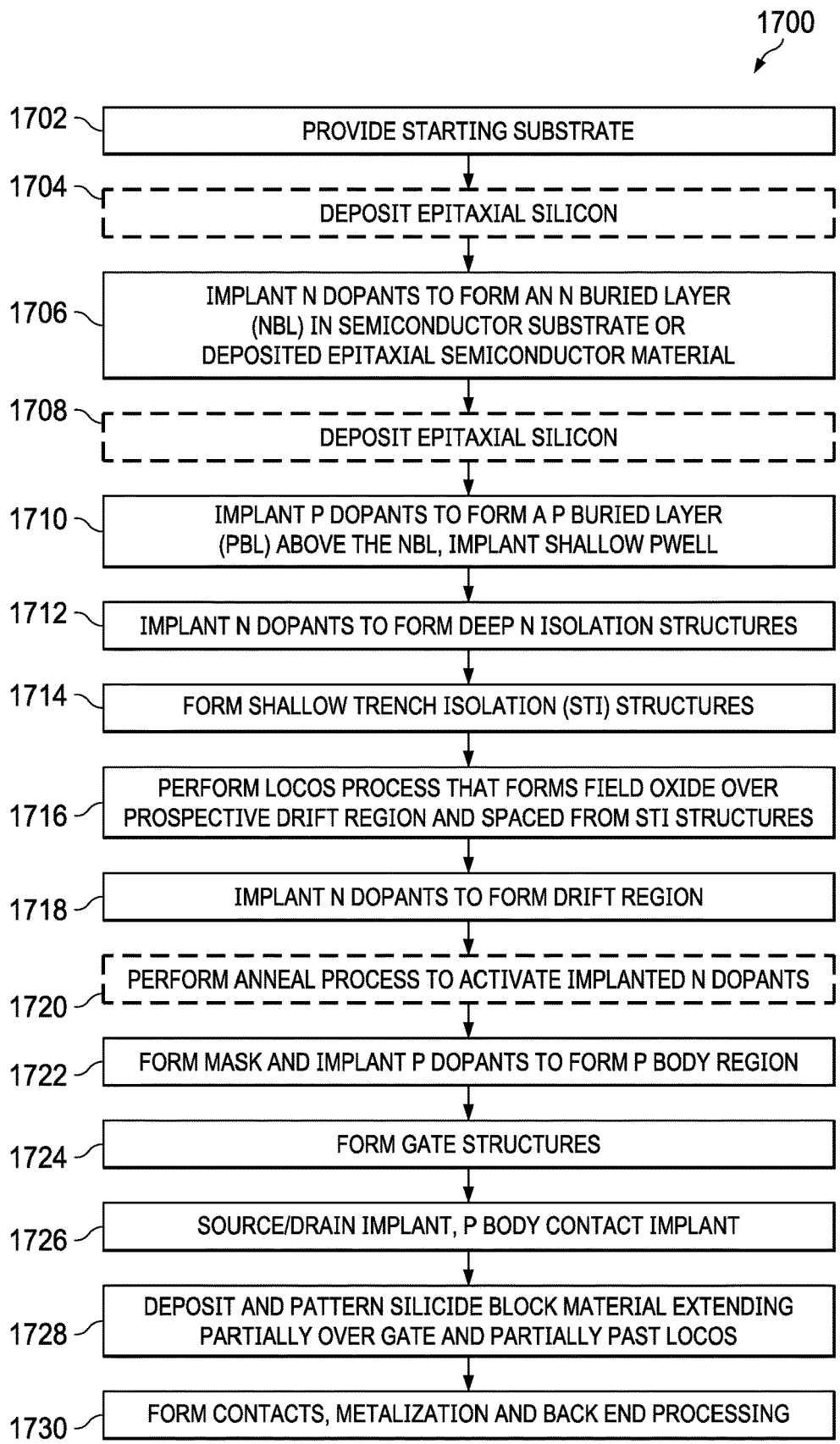
FIG. 17 is a flow diagram showing a method for making a drain extended transistor.
Figure 18:
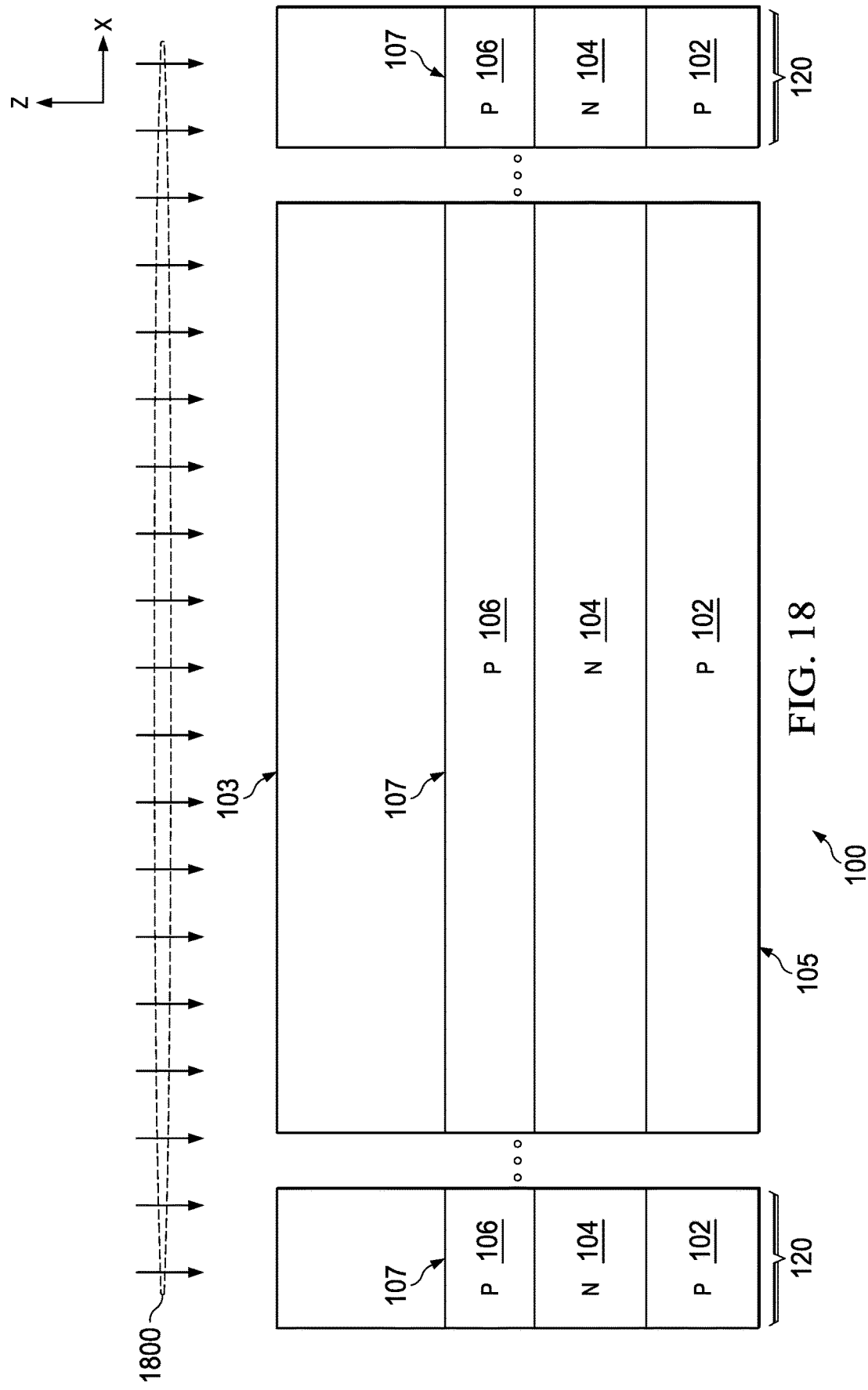
FIGS. 18-28 are partial sectional side elevation views of the integrated circuit at different stages of fabrication to provide the drain extended transistor of FIGS. 1-3.

FIG. 17 shows a method 1700 to fabricate an integrated circuit and an extended drain transistor, such as the transistor 101 of FIGS. 1-16. FIGS. 18-28 illustrate processing of the example integrated circuit 100 at various intermediate stages of fabrication to produce the n-channel transistor 101 of FIG. 1 according to the method 1700. In other examples, p-channel extended drain transistors can be fabricated according to the method 1700 using opposite dopant implantation steps and materials. A starting substrate is provided at 1702. In one example, a p-doped silicon wafer substrate is provided at 1702, such as the substrate 102 in FIG. 18. The example substrate 102 includes the first (e.g., top) side 103, and a second (e.g., bottom) side 105 as shown in FIG. 18. In another example, a silicon on insulator (SOI) starting wafer is used. A substrate of a different semiconductor material can be provided at 1702 in other implementations. In one example, one or more epitaxial layers (not shown) are formed on the substrate 102 using epitaxial growth deposition processing (e.g., at 1704 and 1708), and the transistor 101 is formed in an epitaxial layer of the substrate 102. In other implementations, the epitaxial layer and the processing at 1704 are omitted.

In the illustrated example, a first epitaxial silicon deposition process is performed at 1704, for example, to form a first epitaxial layer over a silicon substrate 102. An implantation process is performed at 1706, which implants n-type dopants (e.g., phosphorus) into the substrate 102 (or into the first epitaxial layer) to form an NBL region in the substrate 102 (e.g., NBL 104 in FIG. 18). In one example, the n-type dopants are implanted via a blanket implantation process (not shown in FIG. 18) into the first epitaxial layer to form the NBL region 104 at 1706, followed by deposition of a second epitaxial layer at 1708 over the NBL doped layer 104. At 1710, an implantation process is performed (e.g., blanket implantation process 1800 in FIG. 18), which implants p-type dopants (e.g., boron) into the second epitaxial layer of the substrate 102 to form a p-doped layer (e.g., PBL 106) in the substrate 102 above the NBL region 104. In one possible implementation, the drain extended transistor 101 is subsequently formed on and/or in the second epitaxial layer, including implantation of p-type dopants above the PBL 106 to provide a shallow implanted region (e.g., p-well) at 1510.

Figure 19:
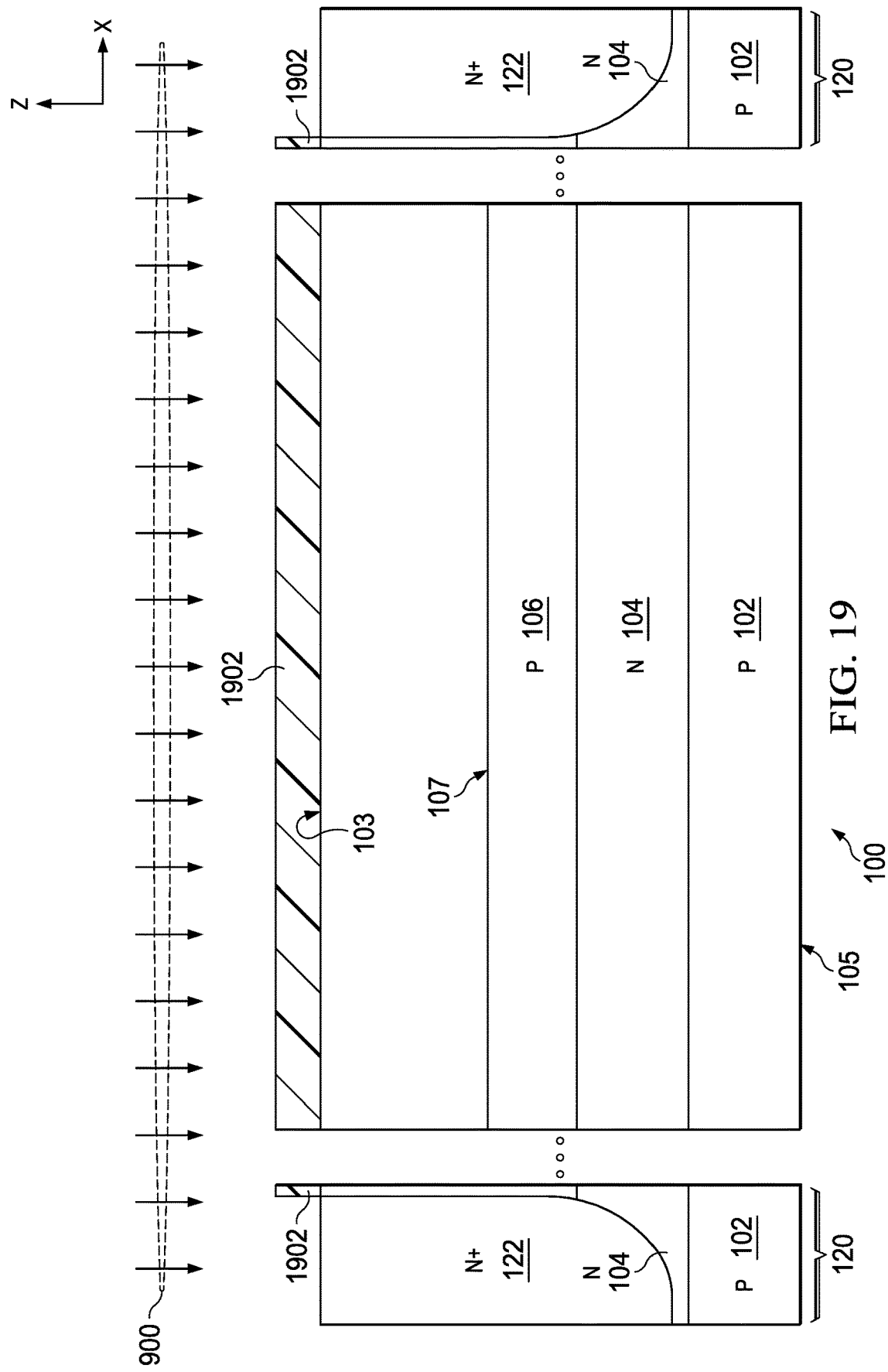
Figure 20:
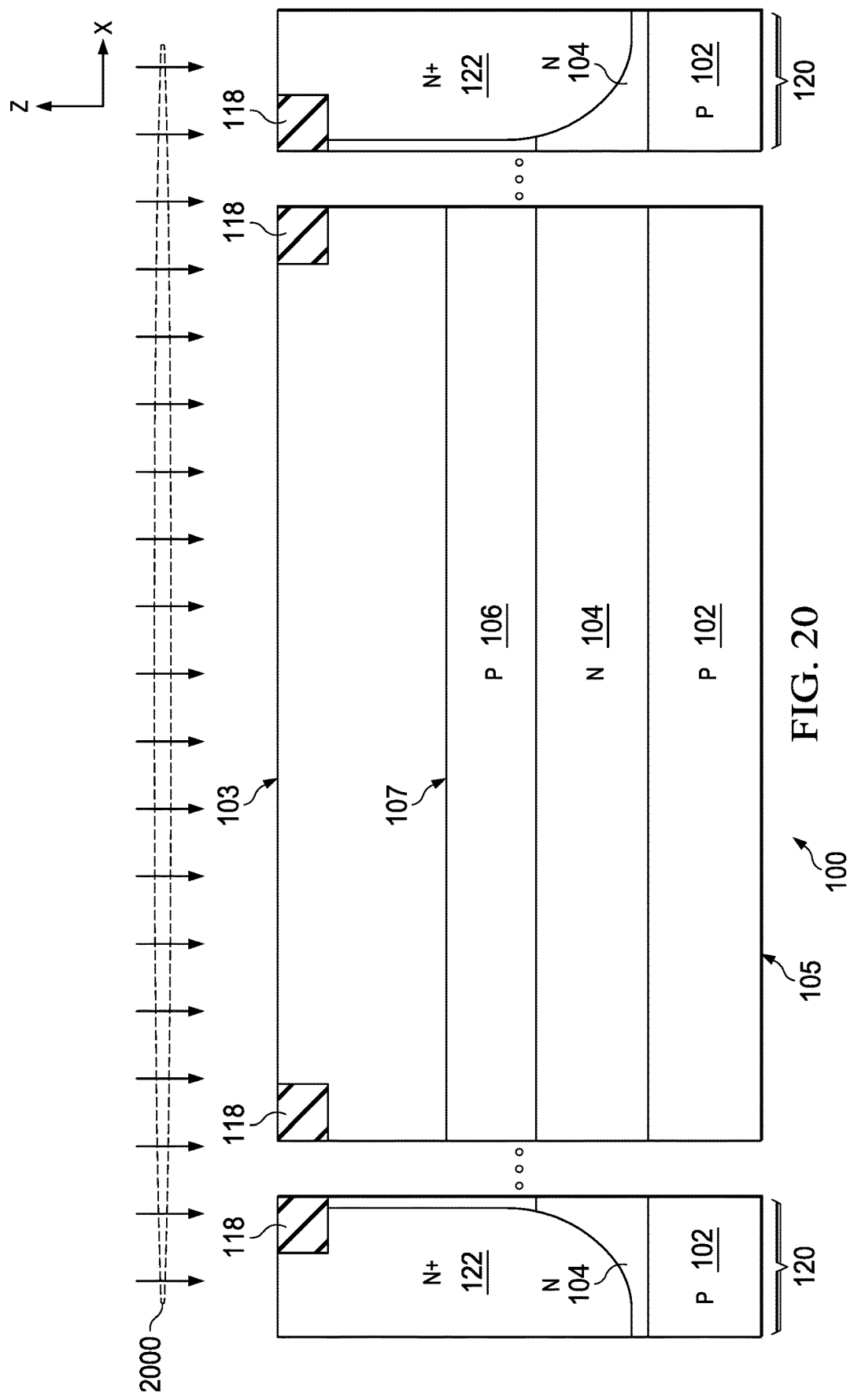

The illustrated method 1700 in one example includes forming an isolation structure at 1712 that surrounds an active region of the substrate and any deposited epitaxial layers (e.g., isolation structure 120 in FIGS. 1-3). In one example, a masked implantation process is performed at 1712, which implants n-type dopants into exposed portions of the structure outside the prospective active region to form a deep n-doped region. FIG. 19 illustrates one example, in which a deposition process 1900 implants phosphorus or other n-type dopants using an implantation mask 1902, to form the deep n-doped region 122 (e.g., labeled N+) that extends laterally outward of the active region. In one implementation, the n-doped region 122 is implanted with suitable implantation energy to extend into at least an upper portion of the NBL region 104. The example method 1700 also includes forming a shallow trench isolation STI structure 118 at 1714, which laterally surrounds the prospective active region of the semiconductor substrate 102. FIG. 20 illustrates a shallow trench isolation process 2000 that forms the STI structure 118 to complete the isolation structure 120. In one example, the isolation structure 118 is formed laterally outward of the prospective source region using the process 2000. In one example, trenches are etched and filled with oxide to form the structure 118. In one example, the STI isolation structure 118 in FIG. 1 extends downward into the substrate to a depth of approximately 0.35 μm. The isolation structure 118 may, but need not, have an upper surface that is generally coplanar with the upper surface of the substrate 102.

In another example, the isolation structure 120 can be fabricated using deep trench processing techniques. In one example, a trench is etched through the PBL layer 106 and the NBL layer 104 and into the portion of the p substrate 102 beneath the NBL layer 104. An N+implantation is performed to dope trench sidewall structures (not shown) to a depth into the NBL layer 104, and the sidewalls are oxidized to form field oxide structures (not shown). A silicon deposition process is performed with in-situ P+doping to form a p-doped structure between the oxide structures, leaving a deep trench isolation structure (not shown).

Figure 21:
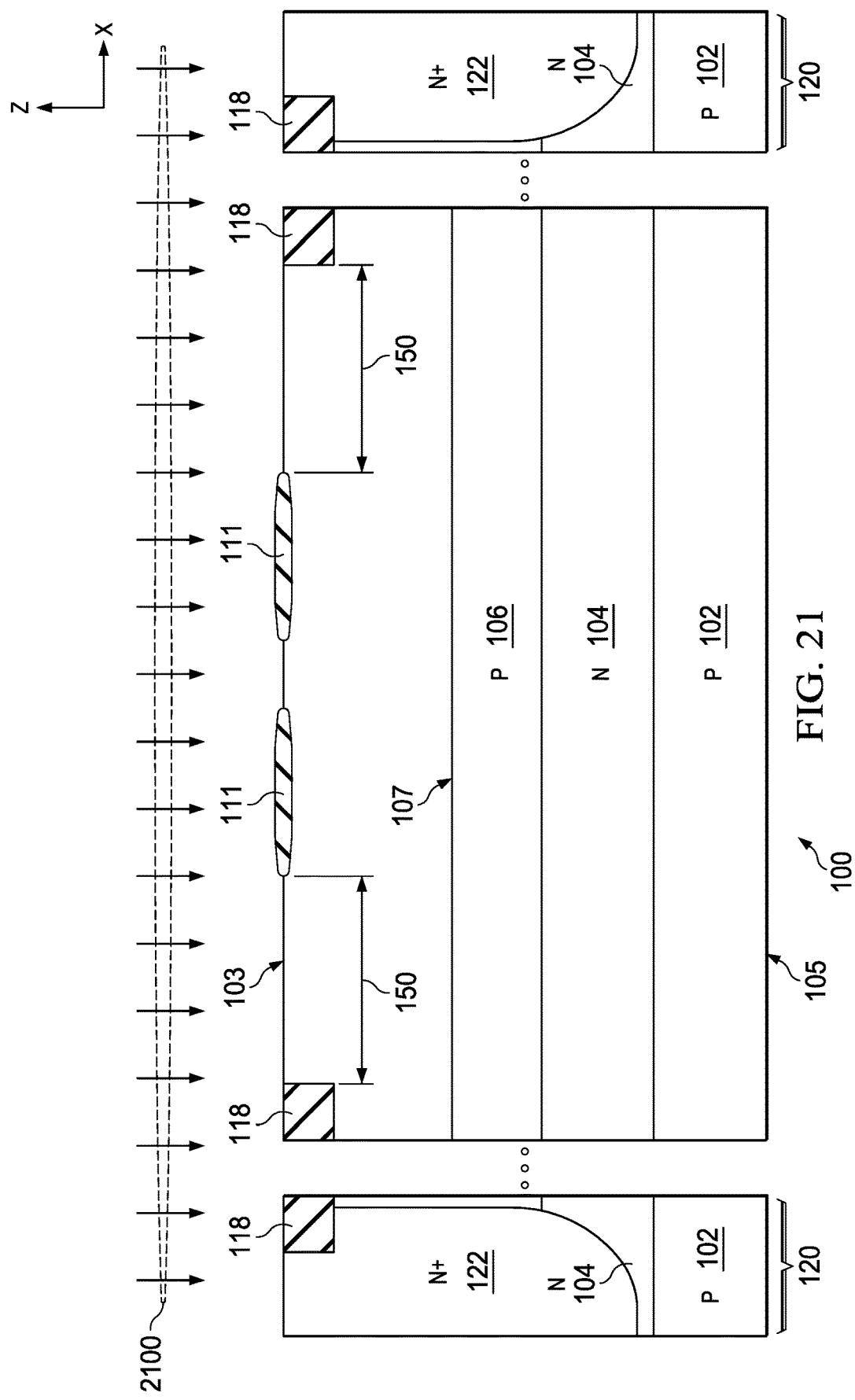
Figure 22:
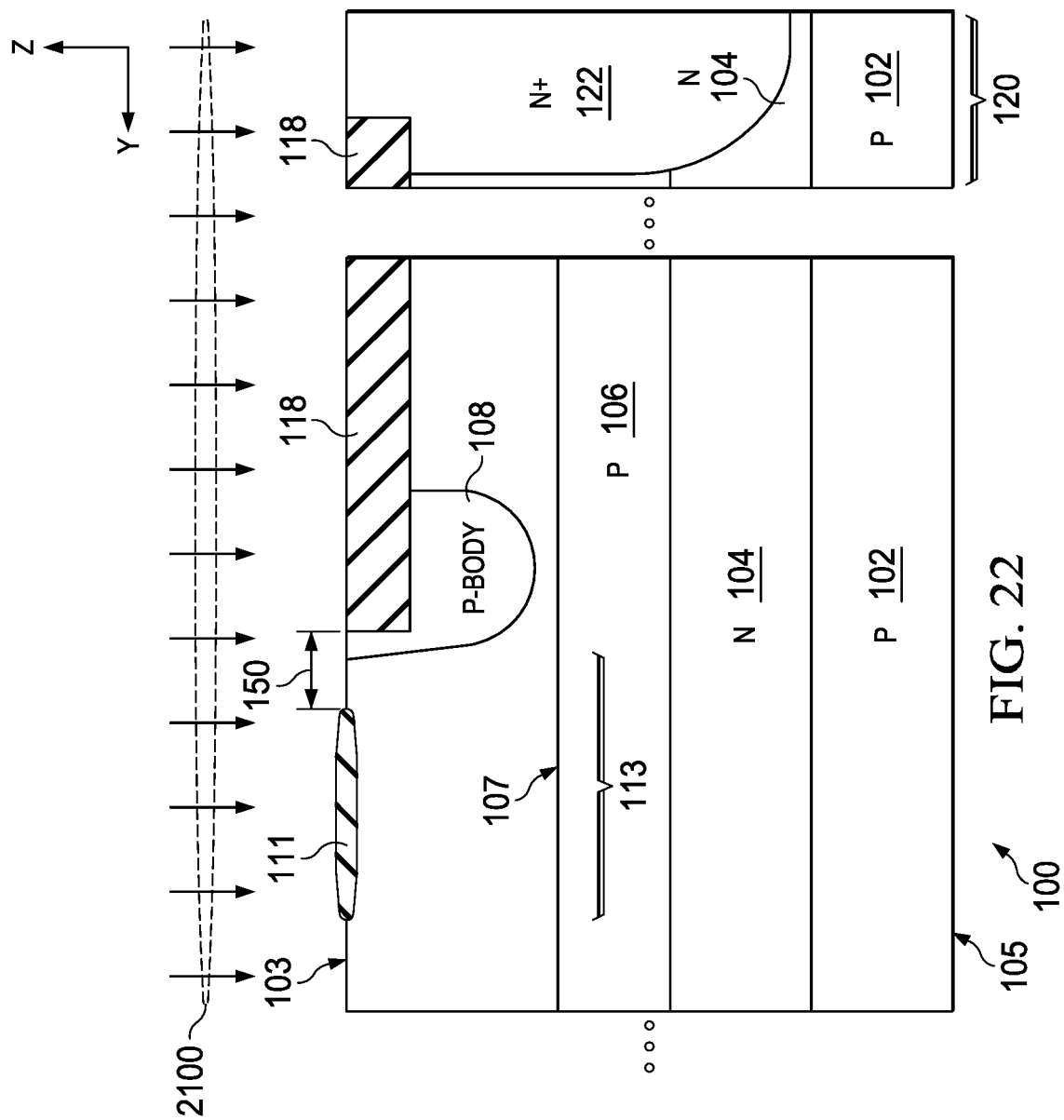

The method 1700 also includes forming an oxide structure at 1716 along the first side 103 of the semiconductor substrate 102. In the example of FIGS. 21 and 22, a local oxidation of silicon (LOCOS) process 2100 is performed, which forms the oxide structure 111 along the top side 103 in a portion of a prospective drift region 113 (FIG. 1). The oxide structure 111 is formed at 1716 over a prospective drift region. In the illustrated example, moreover, the oxide structure 111 is spaced by the distance 150 from the STI structure 118. Other oxide formation processes can be performed at 1716 in other implementations. In one example, the oxide structure 111 is formed at 1716 to a thickness of 500 angstroms or more and 1500 angstroms or less. In another example, the oxide structure 111 is formed at 1716 to a thickness of 700 angstroms or more and 1100 angstroms or less.

Figure 23:
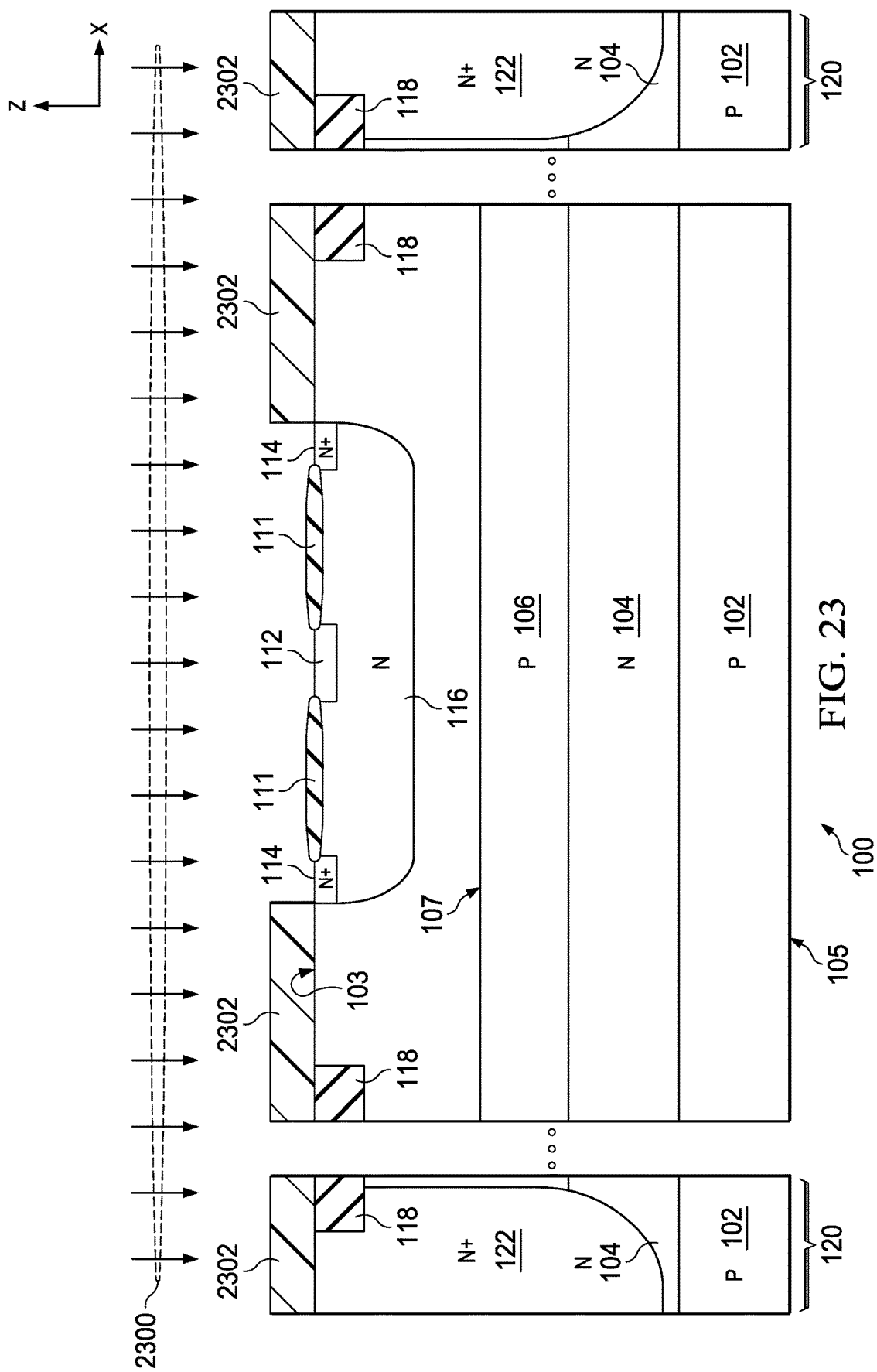

At 1718 in FIG. 17, a least one implantation process is performed, such as an implantation process 2300 in FIG. 23, which implants n-type dopants into the semiconductor substrate 102 at a first energy and a first dopant concentration using a mask 2302. In one example, first and second drift region portions 114 and 116 are created at 1718 by a process 2300 that includes corresponding first and second implantations that use a single implant mask 2302 and different implant energies. In certain implementations, moreover, the first and second implantation processes use different implant doses, although not a strict requirement of all possible implementations. In addition, the first and second implantation processes at 1718 can use different dopant species (e.g., phosphorus, arsenic), and the individual first and second implantation processes can be implemented using multiple implants. In the example of FIG. 23, the mask 2302 is formed, which covers prospective source and body regions, and exposes the oxide structure 111 and a first portion of the first side 103 of the semiconductor substrate 102. The implantation process 2300 (1718 in FIG. 17) forms the first drift region portion 114 that extends into the semiconductor substrate 102 along the Z direction from the first portion of the first side 103. In the example of FIG. 23, moreover, the first mask 2302 exposes the prospective drain region 112 laterally outward of the oxide structure 111 along the X direction. In this example, the process 2300 also implants the n-type dopants into the drain region 112. In other implementations, the mask 2302 covers the prospective drain region 112. In one example, the oxide structure 111 blocks the dopants from the first implantation process.

In various implementations, the thickness of the oxide structure 111 along the vertical (Z) direction is tuned in combination with the implant energy of the first implantation process to completely or substantially block implantation of dopants in the first implantation process at 1718 into the substrate 102 beneath the oxide structure 111. This example also includes performing a second implantation process at 1718 using the mask 2302, which implants n-type dopants into the semiconductor substrate 102 at a second energy and a second dopant concentration. The second example implantation at 1718 forms the second drift region portion 116 that extends into the semiconductor substrate 102 at least partially under the oxide structure 111 along the Z direction. In one example, the second energy is greater than the first energy. In one example, the second implantation process 2300 includes more than one implant. In one example, a thermal anneal process is performed at 1720, which activates the n-type drift region dopants implanted at 1718.

Figure 24:
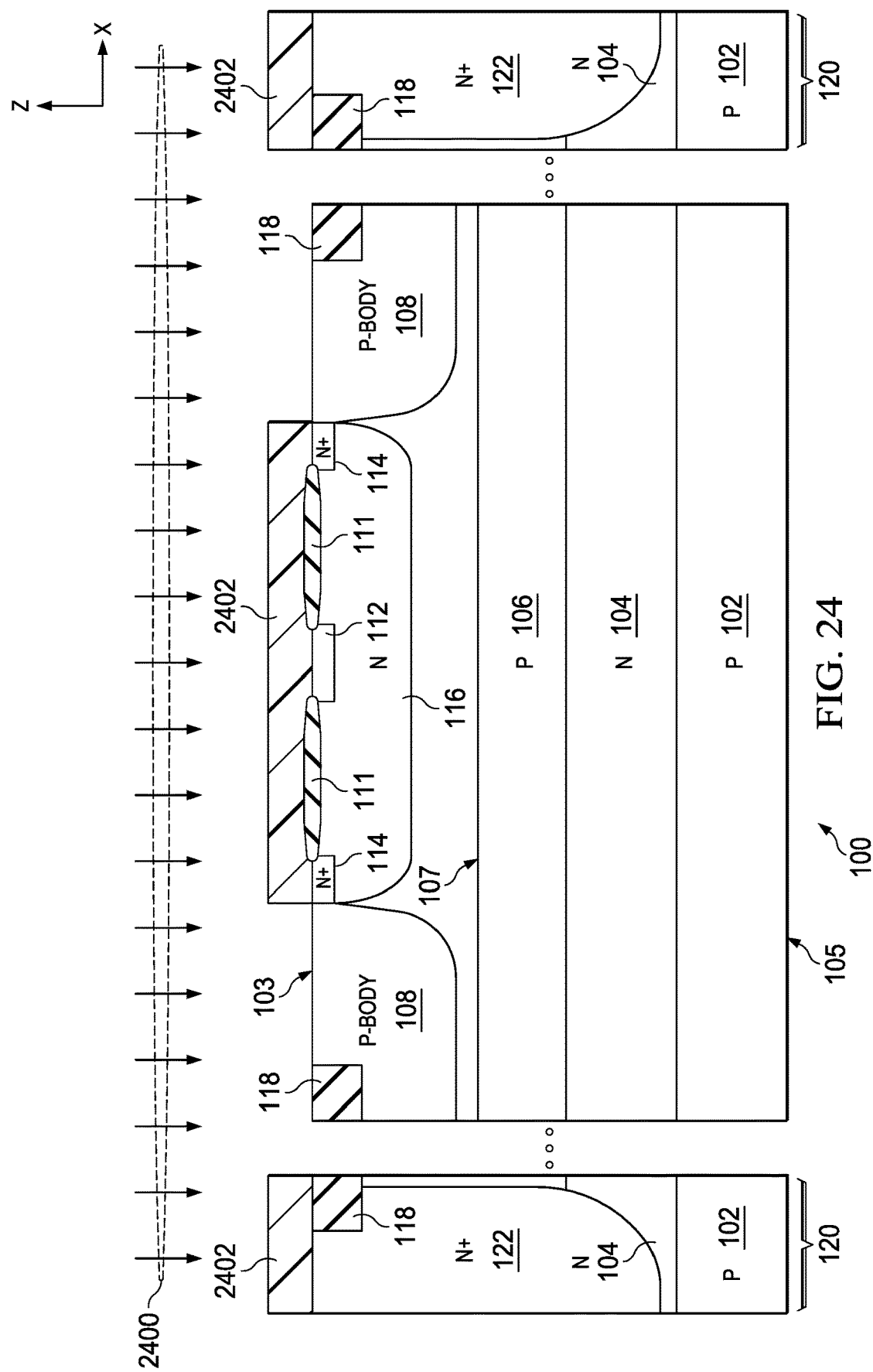
Figure 25:
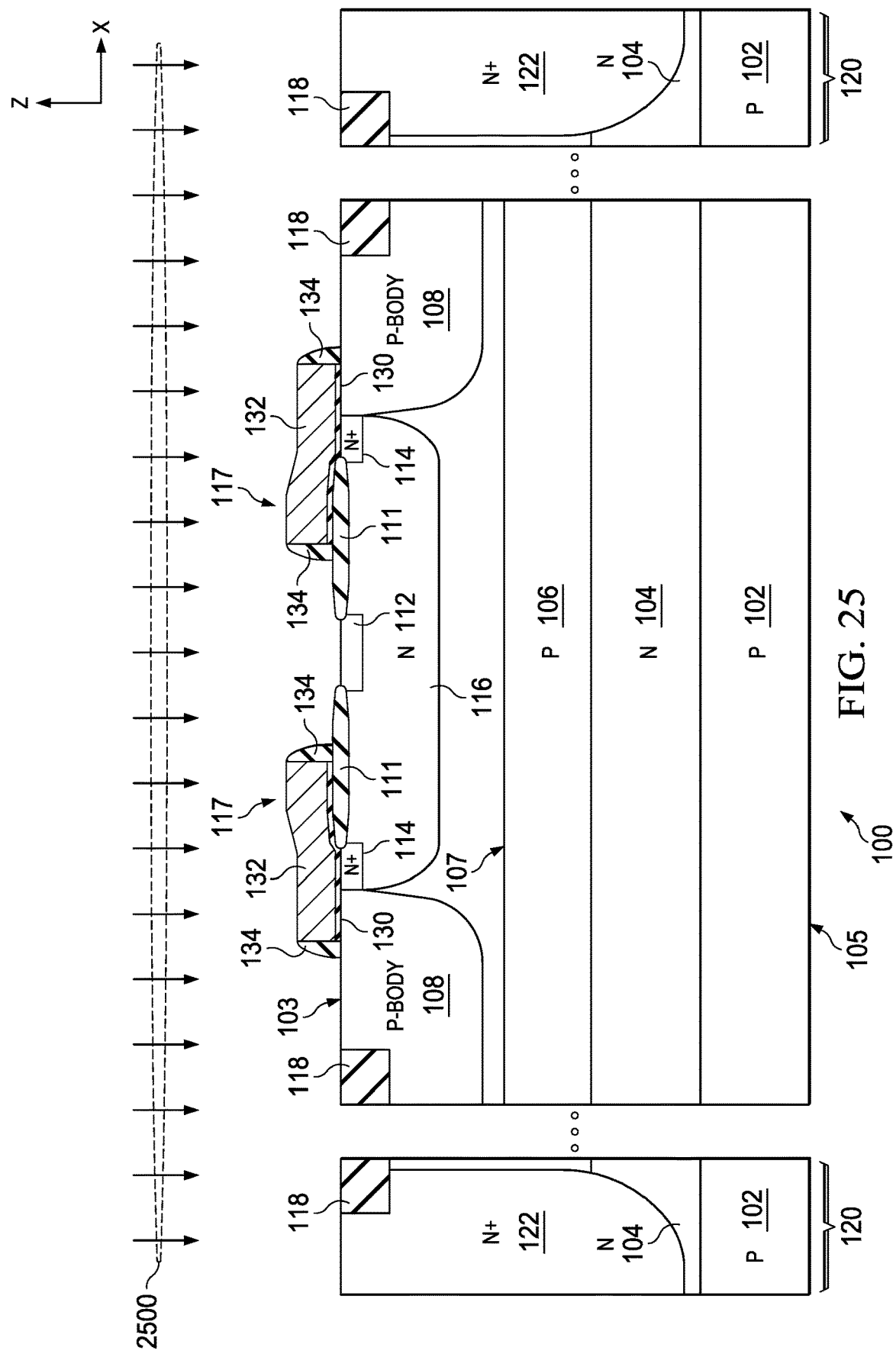

At 1722 in FIG. 17, the method 1700 further includes forming a source/drain implant mask and implanting p-type dopants to form a body region. FIG. 24 shows an example implantation process 2400 performed using a mask 2402, which forms the body region 108. The implanted body region 108 includes a channel portion 109 laterally adjacent the first drift region portion 114 along the X direction (FIG. 1). The example method 1700 also includes forming a gate structure at 1724. FIG. 25 shows an example, and which gate fabrication processing 2500 is performed to form the gate structure 117 over the channel portion 109 of the body region 108 and over a portion of the oxide structure 111. The gate dielectric layer 130 in this example extends over the channel region 109 of the body region 108, and extends over the connection (e.g., first) drift region portion 114 and a portion of the oxide structure 111 to form a short channel compact gate configuration to control the prospective drain extended transistor. The gate electrode 132 in this example is patterned polysilicon formed over a portion of the gate dielectric layer 130, and sidewall spacers 134 are formed along the lateral sides of the polysilicon gate electrode 132 as shown in FIG. 25.

Figure 26:
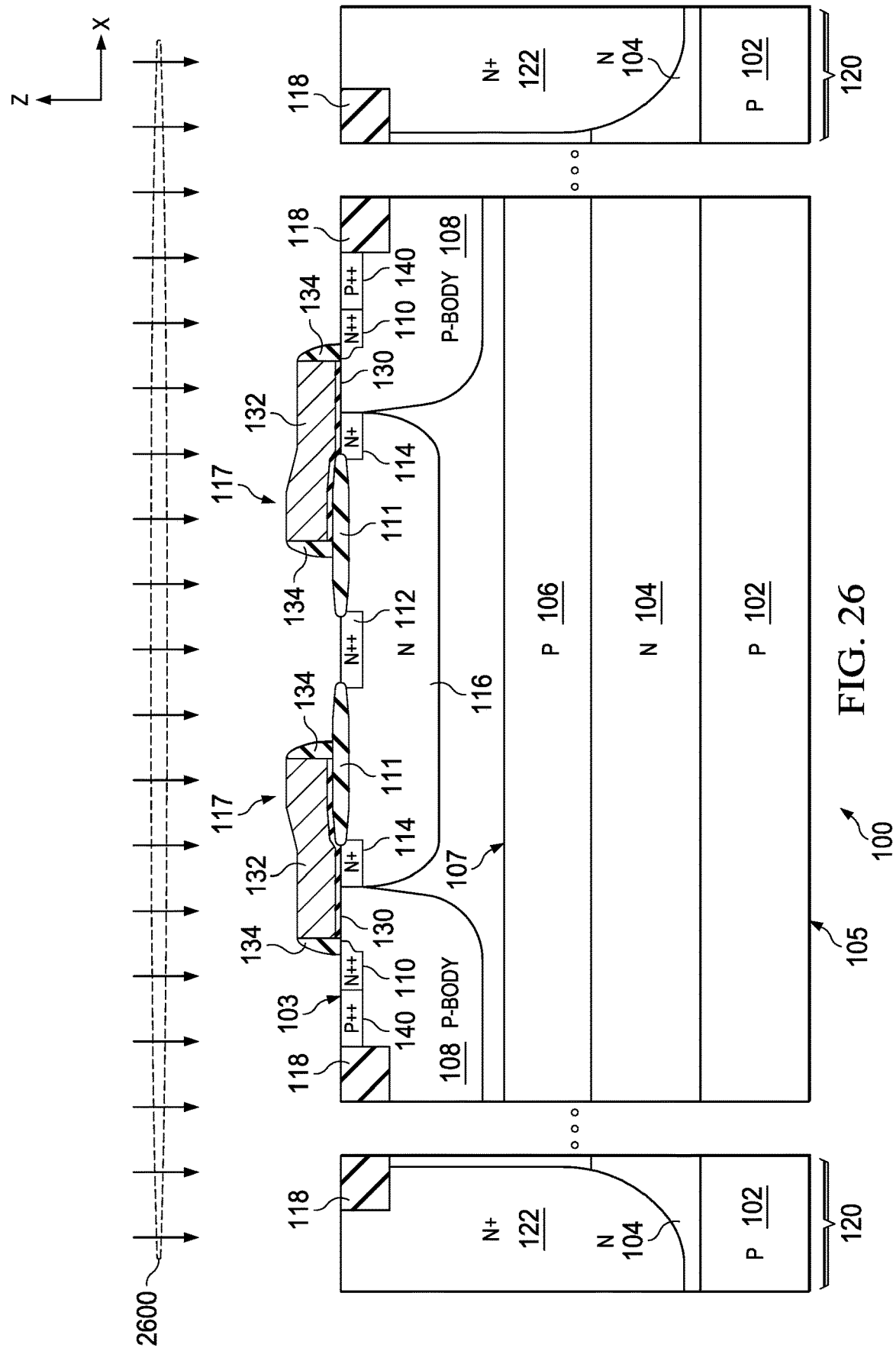

The method 1700 continues at 1726 in FIG. 17, including implanting the source region 110 and the drain region 112 with n-type dopants. FIG. 26 shows an example, in which implantation processing 2600 is performed with suitable implant masks (not shown). The implantation processing 2600 implants phosphorus or other n-type dopants to form the source region 110 adjacent the channel portion 109 of the body region 108, and the drain region 112 adjacent the second drift region portion 116 and the oxide structure 111. The implantation process 2600 in one example supplements the previously implanted n-type dopants in the drain region 112. In one example, the processing at 1726 also includes performing a masked implantation process (not shown) to implant p-type dopants (e.g., boron), to form the p-type body contact region 140 shown in FIG. 26.

Figure 27:
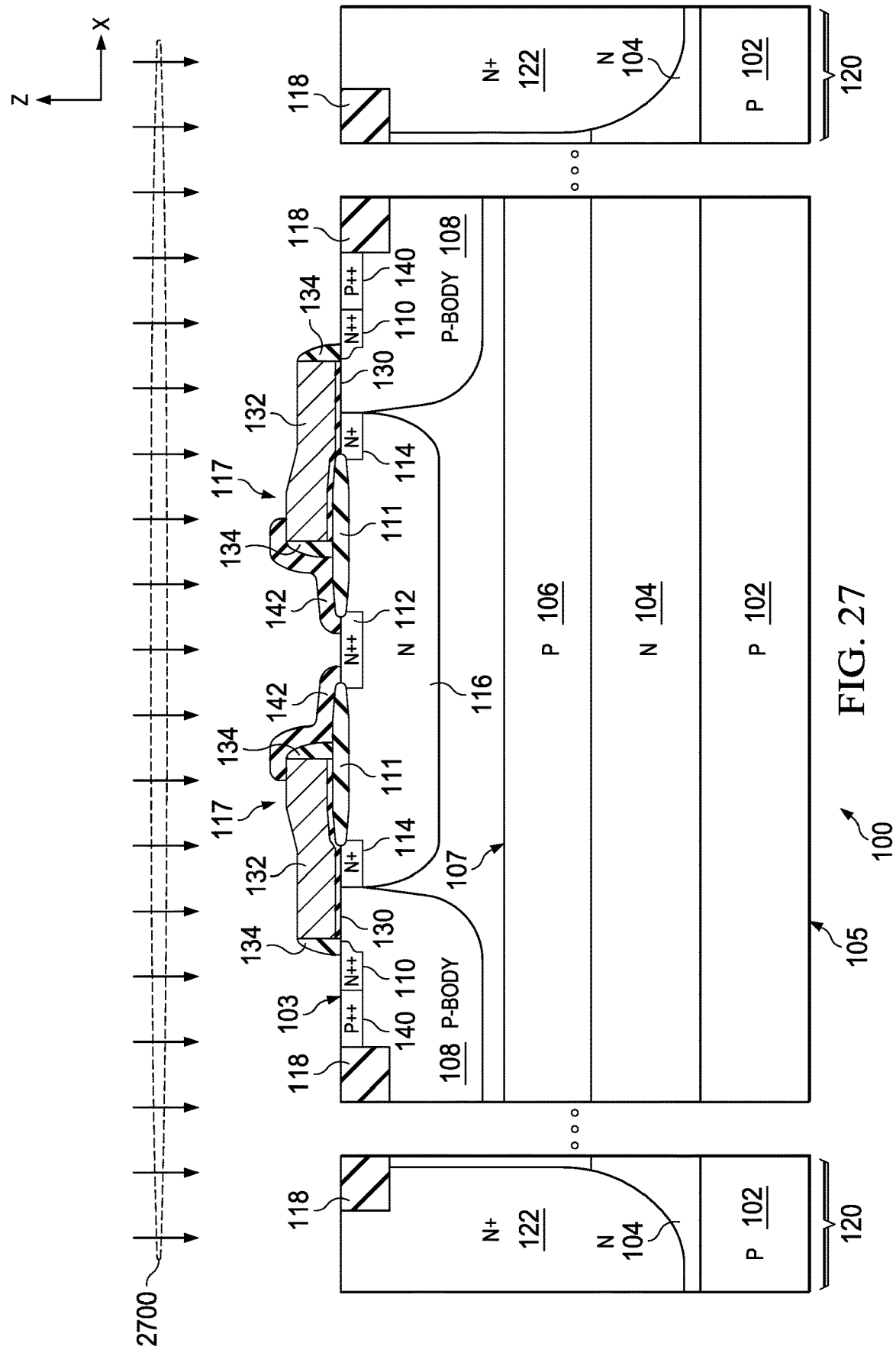
Figure 28:
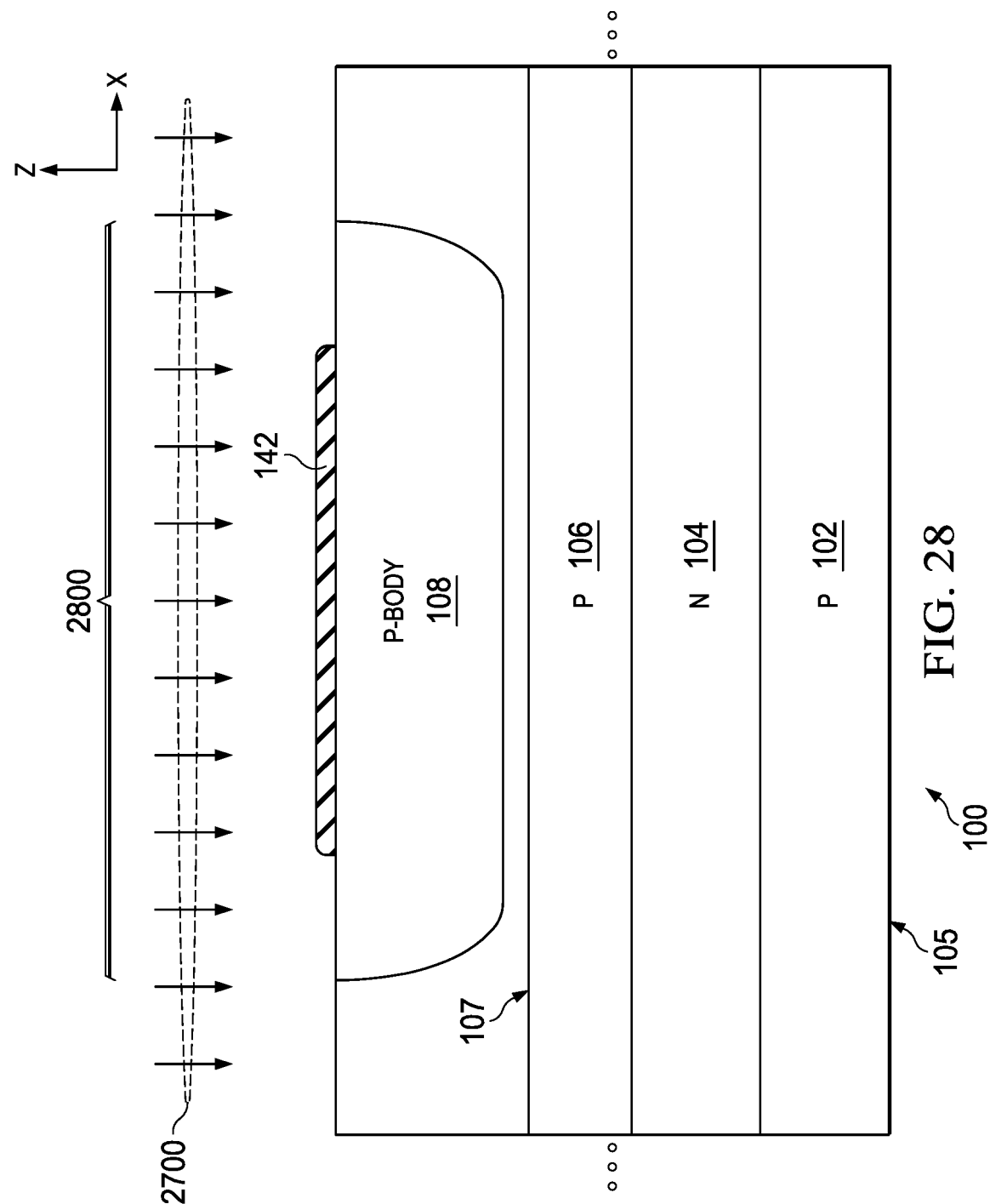

The method 1700 also includes forming a protection layer at 1728. In the example of FIG. 27, a process 2700 is used to deposit and pattern a silicide block material 142 that extends over the exposed portion of the oxide structure 111. In addition, the example protection layer material 142 in FIG. 27 extends partially over the gate electrode 132 and partially past the oxide structure 111. As previously mentioned, the protection layer material 142 in one example is a silicide block material that is used elsewhere in the fabrication of the IC 100. FIG. 28 shows another portion of the IC 100, in which a portion of the body region 108 is used to form a resistor component. In this example, the deposition and patterning processing at 1728 is used to form a silicide block material structure 142 in the center regions of the prospective resistor component 2800, leaving end regions of the resistor structure 2800 exposed for subsequent solicitation to form first and second resistor terminals or contacts. In one example, the protection layer 142 includes an oxide material and/or a nitride material. The method 1700 also includes further processing at 1730, which forms contacts, metallization structures and to complete other back end processes to finish the integrated circuit 100.

Modifications are possible in the described embodiments, and other embodiments are possible, within the scope of the claims.

The following is claimed:

1. An integrated circuit (IC) having a drain extended transistor, the drain extended transistor comprising:
    a plurality of transistor finger structures formed in an active region of a semiconductor substrate, each of the transistor finger structures extending in a first direction, wherein the plurality of transistor finger structures includes: a plurality of body region fingers; a plurality of source fingers; a plurality of oxide fingers, a plurality of drain fingers; a plurality of drift region fingers, and a plurality of gate fingers;
    wherein one of the drain fingers is positioned at a center of the drain extended transistor along a second direction orthogonal to the first direction; and
    wherein the plurality of body region fingers includes a body region, the plurality of drain fingers comprise a drain region, and the body region laterally surrounds the drain region along the first direction and the second direction.

2. The IC of claim 1, wherein:
    the plurality of body region fingers each includes a portion of the body region that extends along the first direction, the body region including: majority carrier dopants of a first type; and a channel portion;
    the plurality of source fingers each includes a source region that extends along the first direction, the source region adjacent a first side of the channel portion of the body region, the source region including majority carrier dopants of a second type; and
    the plurality of drain fingers each includes a portion of the drain region that extends along the first direction, the drain region including: majority carrier dopants of the second type, and a first end.

3. The IC of claim 2, wherein:
    the plurality of oxide fingers each includes an oxide structure that extends along the first side of the semiconductor substrate, the oxide structure including: a first end spaced along a second direction from the channel portion of the body region; and a second end adjacent the first end of the drain region;
    the plurality of drift region fingers each includes a drift region, the drift region including majority carrier dopants of the second type, the drift region extending along the first direction, the drift region extending along the second direction from the channel portion of the body region to the drain region; the drift region including a drift region portion separated from the first side along the first direction by at least a portion of the oxide structure; and
    the plurality of gate fingers each includes a gate structure, the gate structure including: a gate dielectric layer formed over the first side of the substrate; and a gate electrode on the gate dielectric layer at least partially above the channel portion of the body region.

4. The IC of claim 3, wherein the plurality of transistor finger structures further includes a plurality of body contact fingers, individual ones of the plurality of body contact fingers including a body contact region laterally adjacent to the source region to provide an electrical connection to the body region, the body contact region including majority carrier dopants of the first type.

5. The IC of claim 4, wherein two of the plurality of body contact fingers are at outer ends of the drain extended transistor along the second direction.

6. The IC of claim 2, wherein the dopants of the first type are p-type dopants, and the dopants of the second type are n-type dopants.

7. The IC of claim 2, further comprising an outer drift region that includes majority carrier dopants of the second type, the outer drift region laterally surrounding the active region of the semiconductor substrate along the first direction and the second direction.

8. The IC of claim 3, wherein the plurality of transistor finger structures further includes a plurality of protection layer fingers, individual ones of the plurality of protection layer fingers including a protection layer that extends on the oxide structure between the gate structure and the drain region, the protection layer including at least one of an oxide material, and a nitride material;
 further comprising inactive finger structures proximate each outer end of the drain extended transistor along the second direction, the individual inactive finger structures including:
  an inactive oxide finger, including an inactive oxide structure that extends along the first side of the semiconductor substrate along a third direction, the third direction being orthogonal to the second direction, and the third direction being orthogonal to the first direction;
  an inactive gate electrode finger, including an inactive gate electrode structure that extends along the first side of the semiconductor substrate along the third direction; and
  an inactive protection layer finger that extends at least partially on the inactive oxide structure, the inactive protection layer finger including at least one of an oxide material, and a nitride material.

9. The IC of claim 8, wherein the inactive gate electrode structure is connected to a reference voltage node.

10. The IC of claim 2, further comprising:
 body contact fingers at outer ends of the drain extended transistor along the second direction, individual ones of the plurality of body contact fingers including a body contact region laterally adjacent to an outermost source region to provide an electrical connection to the body region, the body contact region including majority carrier dopants of the first type;
 inactive body contact regions at lateral ends of the individual ones of the source fingers along the first direction and the inactive body contact regions including majority carrier dopants of the first type; and
 inactive source/drain implant regions at lateral ends of the drain fingers along the third direction, the inactive source/drain implant regions including majority carrier dopants of the second type.

11. The IC of claim 10, further comprising inactive drift regions at the lateral ends of the drain fingers along the third direction, the inactive drift regions including majority carrier dopants of the second type.

12. An integrated circuit (IC) having a drain extended transistor, the drain extended transistor comprising:
 a body region having body region fingers extending in a first direction, the body region having majority carrier dopants of a first type and a channel portion;
 a source region having source fingers extending in the first direction, the source region having majority carrier dopants of a second type;
 a drain region having drain fingers extending in the first direction, the drain region having majority carrier dopants of the second type and a first end;
 a drift region having drift region fingers extending in the first direction, the drift region including majority carrier dopants of the second type, the drift region extending along a second direction from the channel portion of the body region to the drain region, the second direction being orthogonal to the first direction; and
 a gate structure having gate fingers at least partially above the channel portion of the body region;
 wherein one of the drain fingers is positioned at a center of the drain extended transistor along the second direction; and
 wherein the body region laterally surrounds the drain region along the first direction and the second direction.

13. The IC of claim 12, further comprising an oxide structure including: a first end spaced along a second direction from the channel portion of the body region; and a second end adjacent the first end of the drain region.

14. The IC of claim 12, wherein the dopants of the first type are p-type dopants, and the dopants of the second type are n-type dopants.

15. The IC of claim 12, further comprising an outer drift region that includes majority carrier dopants of the second type, the outer drift region laterally surrounding the active region of the semiconductor substrate along the first direction and the second direction.

16. An integrated circuit (IC) having a drain extended transistor, the drain extended transistor comprising:
 a body region having body region fingers extending in a first direction, the body region having majority carrier dopants of a first type and a channel portion;
 a source region having source fingers extending in the first direction, the source region having majority carrier dopants of a second type;
 a drain region having drain fingers extending in the first direction, the drain region having majority carrier dopants of the second type and a first end;
 a drift region having drift region fingers extending in the first direction, the drift region including majority carrier dopants of the second type, the drift region extending along a second direction from the channel portion of the body region to the drain region, the second direction being orthogonal to the first direction; and
 a gate structure having gate fingers at least partially above the channel portion of the body region;
 wherein one of the drain fingers is positioned at a center of the drain extended transistor along the second direction;
 wherein the body region laterally surrounds the drain region along the first direction and the second direction; and
 a plurality of body contact fingers, individual ones of the plurality of body contact fingers including a body contact region laterally adjacent to the source region to provide an electrical connection to the body region, the body contact region including majority carrier dopants of the first type.

17. The IC of claim 16, wherein two of the plurality of body contact fingers are at outer ends of the drain extended transistor along the second direction.

* * * * *